(12) United States Patent
Ikumi et al.

(10) Patent No.: US 11,924,985 B2
(45) Date of Patent: Mar. 5, 2024

(54) DISPLAY DEVICE

(71) Applicant: Yazaki Corporation, Tokyo (JP)

(72) Inventors: Junichi Ikumi, Makinohara (JP);
Masaaki Sano, Makinohara (JP); Naoki Ueno, Makinohara (JP); Akira Masuda, Makinohara (JP); Takahiro Shimada, Makinohara (JP); Takeshi Iwamoto, Makinohara (JP); Shota Kosuga, Makinohara (JP); Ryuta Suzuki, Shimada (JP); Satoru Kanazawa, Shimada (JP); Junnosuke Nishimura, Shimada (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/961,331

(22) Filed: Oct. 6, 2022

(65) Prior Publication Data
US 2023/0112001 A1 Apr. 13, 2023

(30) Foreign Application Priority Data

Oct. 11, 2021 (JP) ................................ 2021-166926

(51) Int. Cl.
*H05K 5/02* (2006.01)
*H05K 5/00* (2006.01)
(52) U.S. Cl.
CPC ......... *H05K 5/0217* (2013.01); *H05K 5/0008* (2013.01); *H05K 5/0018* (2022.08)

(58) Field of Classification Search
CPC .. H05K 5/0217; H05K 5/0008; H05K 5/0018; G06F 1/1601; G06F 1/1637; G02F 1/133308
See application file for complete search history.

(56) References Cited

U.S. PATENT DOCUMENTS

| | | | | |
|---|---|---|---|---|
| 5,268,816 A | * | 12/1993 | Abell, Jr. .............. | G06F 1/1671 361/679.55 |
| 5,486,942 A | * | 1/1996 | Ichikawa .......... | G02F 1/133308 349/84 |
| 6,002,582 A | * | 12/1999 | Yeager .............. | G02F 1/133308 345/905 |

(Continued)

FOREIGN PATENT DOCUMENTS

| | | |
|---|---|---|
| JP | 2010-281897 A | 12/2010 |
| JP | 2016-102706 A | 6/2016 |
| WO | 2014/102470 A1 | 7/2014 |

*Primary Examiner* — Sagar Shrestha
(74) *Attorney, Agent, or Firm* — Sughrue Mion, PLLC

(57) ABSTRACT

A display device includes a display panel that includes a first hole and a device housing that is configured such that the display panel is fastened and fixed to the device housing by a screw passed through the first hole and screwed into the screw hole. The display panel includes a display-side positioning part which is configured to fit to a portion of the device housing to perform positioning of the display panel with respect to the device housing and which includes the first hole, and the device housing includes a housing-side positioning part which is configured to fit to the display-side positioning part to perform the positioning and which includes a second hole formed so as to communicate with the first hole when the housing-side positioning part is fitted to the display-side positioning part.

7 Claims, 21 Drawing Sheets

(56) References Cited

U.S. PATENT DOCUMENTS

| | | | | |
|---|---|---|---|---|
| 6,130,658 A * | 10/2000 | Yamamoto | G02F 1/133604 | 361/679.22 |
| 6,229,695 B1 * | 5/2001 | Moon | G06F 1/1658 | 345/905 |
| 2002/0064036 A1 * | 5/2002 | Yano | G02F 1/133308 | 361/809 |
| 2005/0225694 A1 * | 10/2005 | Akagawa | G02F 1/133308 | 349/58 |
| 2007/0053144 A1 * | 3/2007 | Nakatani | G06F 1/1679 | 361/679.21 |
| 2007/0076384 A1 * | 4/2007 | Shin | G06F 1/1601 | 361/752 |
| 2007/0076396 A1 * | 4/2007 | Kim | H05K 5/02 | 361/796 |
| 2009/0310065 A1 * | 12/2009 | Dunn | G02F 1/133603 | 349/69 |
| 2010/0033447 A1 * | 2/2010 | Horie | G06F 1/1601 | 345/173 |
| 2011/0285926 A1 * | 11/2011 | Yokote | G06F 1/1637 | 348/841 |
| 2013/0215559 A1 * | 8/2013 | Kim | H04M 1/0249 | 361/679.01 |
| 2015/0042898 A1 * | 2/2015 | Ikuta | G06F 1/1601 | 348/790 |
| 2015/0185537 A1 * | 7/2015 | Yamashita | G02F 1/133308 | 349/58 |
| 2015/0219954 A1 * | 8/2015 | Kubo | G02B 6/0088 | 349/60 |
| 2017/0094813 A1 * | 3/2017 | Taniguchi | G02F 1/133308 | |
| 2017/0159876 A1 * | 6/2017 | Brashnyk | G09F 9/3026 | |
| 2018/0218654 A1 * | 8/2018 | Hashimoto | B60R 11/0229 | |
| 2020/0389987 A1 * | 12/2020 | Kanno | G09F 13/0445 | |
| 2021/0392763 A1 * | 12/2021 | Shen | H05K 5/0217 | |
| 2021/0392764 A1 * | 12/2021 | Kim | H05K 5/0017 | |
| 2023/0209749 A1 * | 6/2023 | Park | H05K 5/0217 | 361/731 |

* cited by examiner

DISPLAY DEVICE

TECHNICAL FIELD

The present invention relates to a display device including a display panel.

BACKGROUND

Conventionally, a display device including a display panel with a display screen such as a liquid crystal display is installed on a vehicle and used to display various information (see, for example, Patent Document 1). In a display device disclosed in Patent Document 1, the display panel is fastened and fixed by a screw so as to cover an opening of a bottomed tube-shaped device housing. In this display device, a screw hole is provided at the device housing, and the display panel is fastened and fixed to the device housing by a screw passed through a through hole located nearer an outer periphery of the display panel and screwed into the screw hole.

RELATED ART DOCUMENT

Patent Document 1: JP 2010-281897 A

SUMMARY OF THE INVENTION

Problem to be Solved by the Invention

However, when assembling the display device as described above, a worker visually positions the through hole located nearer the outer periphery of the display panel and the screw hole of the device housing and then attached a screw. However, this could put a work burden on the worker. In order to reduce this work burden, it is possible that, for example, one of the display panel and the device housing can be provided with a protruded part for positioning and the other one of the display panel and the device housing can be provided with a recessed part that fits to the protruded part. However, providing these positioning portions could lead to an increase in size of the display device.

In view of the drawbacks as described above, an object of the present invention is to provide a display device capable of positioning a display panel and a device housing to perform fastening by a screw while preventing an increase in size of the display device.

Solution to Problem

To achieve the object described above, the present invention provides, in a first aspect, a display device including a display panel including a display screen, the display panel being provided with a first hole from among a through hole and a screw hole for screw fixation, the first hole being formed on an outer periphery side of the display screen, and a device housing having a bottomed tube-shape and including an opening configured to be covered with the display panel, the device housing including a second hole from among the through hole and the screw hole, the second hole being formed at a position that communicates with the first hole, the device housing being configured such that the display panel is fastened and fixed to the device housing by a screw passed through the through hole and screwed into the screw hole, wherein the display panel includes a display-side positioning part which is configured to fit to a portion of the device housing to perform positioning of the display panel with respect to the device housing and on which the first hole is formed, and the device housing includes a housing-side positioning part which is configured to fit to the display-side positioning part to perform the positioning and on which the second hole is formed so as to communicate with the first hole when the housing-side positioning part is fitted to the display-side positioning part.

Advantageous Effect of the Invention

According to the display device described above, the display panel and the device housing can be positioned to perform fastening by a screw while preventing an increase in size of the display device.

BRIEF DESCRIPTION OF THE DRAWINGS

FIG. 28 is guided by a guide hole receiving a pin;

DETAILED DESCRIPTION OF THE EXEMPLARY EMBODIMENT

In the following, one embodiment of a display device is described.

Figure 1:
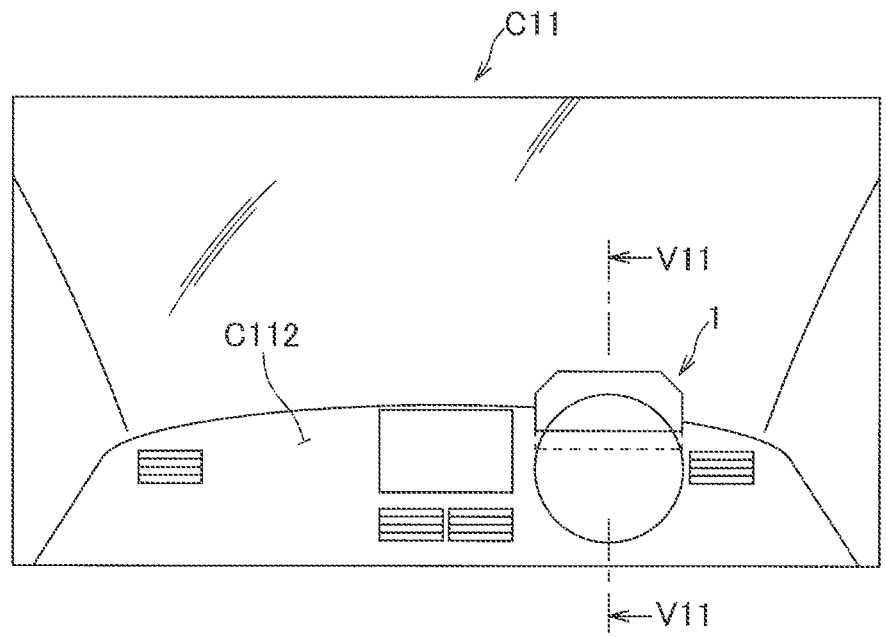
FIG. 1 is a schematic diagram showing a state in which a display device according to one embodiment is installed on a vehicle.
Figure 2:
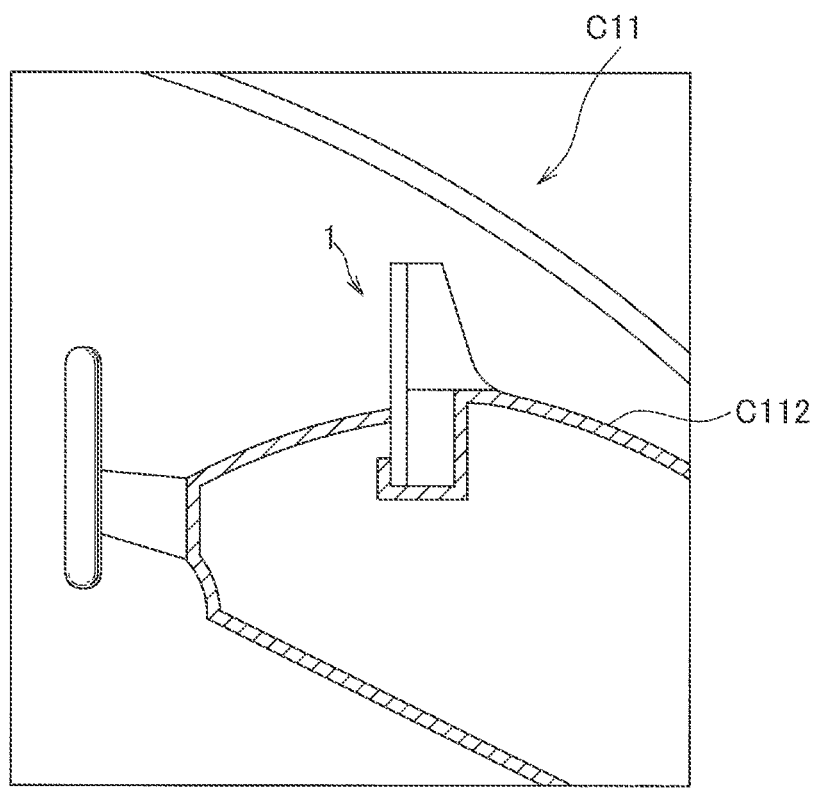
FIG. 2 is a schematic cross-section taken along a line V11-V11 in FIG. 1 showing the installed state of the display device of FIG. 1.

FIG. 1 is a schematic diagram showing a state in which a display device according to one embodiment is installed on a vehicle, and FIG. 2 shows the installed state of the display device of FIG. 1 in a schematic cross-section taken along a line V11-V11 in FIG. 1.

A display device 1 shown in FIG. 1 and FIG. 2 is installed on an instrument panel C112 as an installation place in front of a driver's seat in a vehicle C11. In this embodiment, the display device 1 is installed on the instrument panel C112 in an upright position, with a portion of the display device 1 from a lower end side to a back side embedded and hidden in the instrument panel C112.

Figure 3:
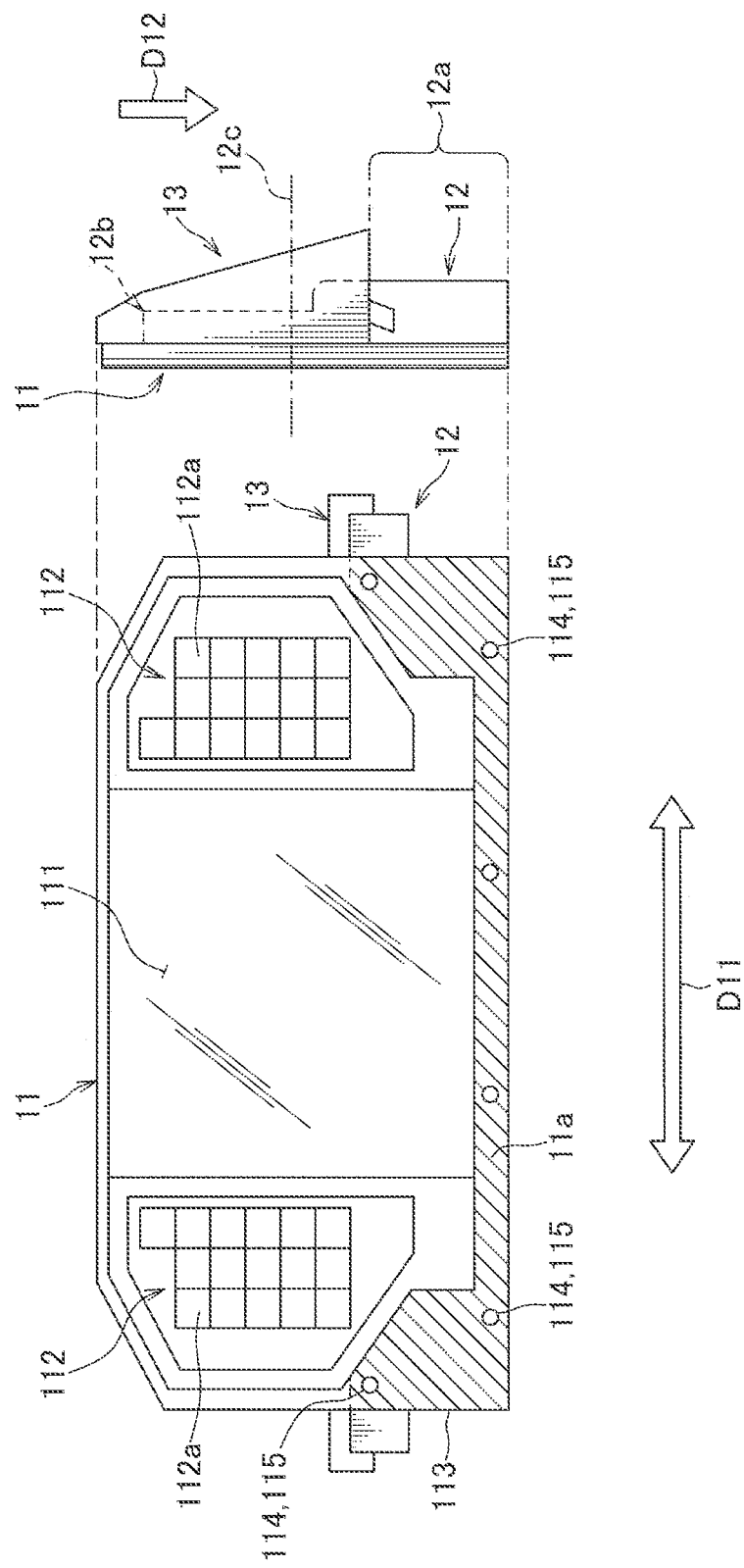
FIG. 3 is a diagram showing a front view and a side view of the display device shown in FIG. 1 and FIG. 2.
Figure 4:
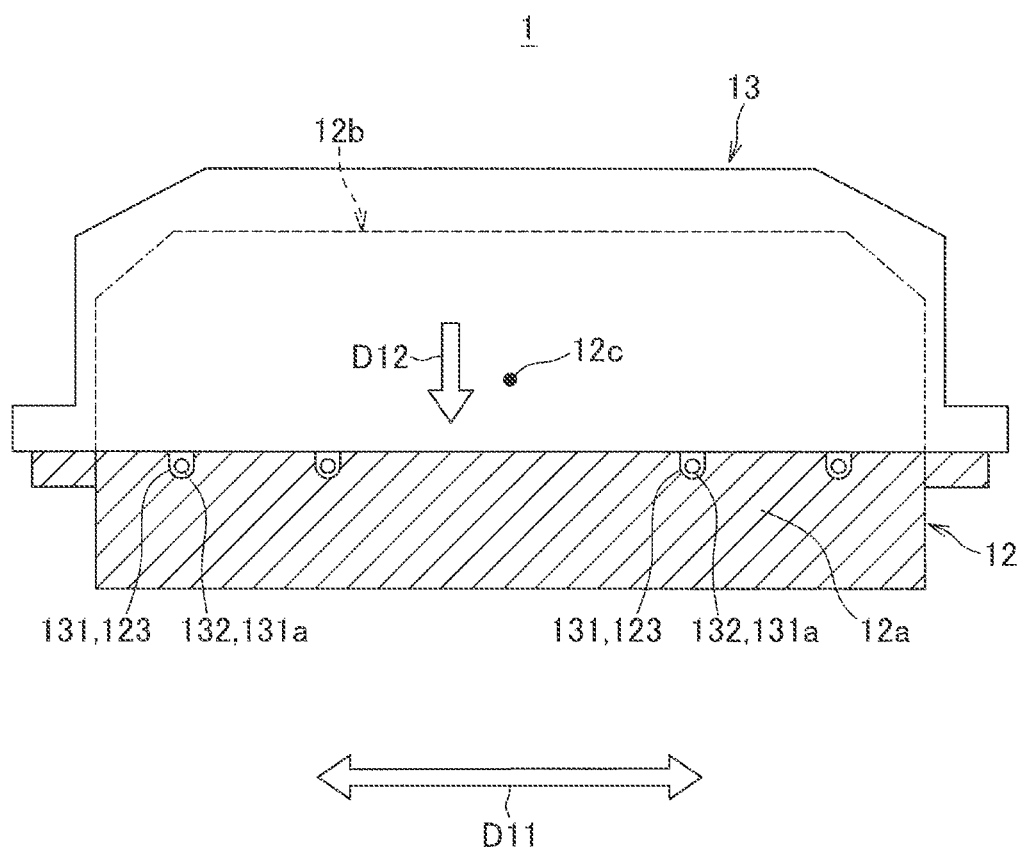
FIG. 4 is a schematic rear view of the display device shown in FIG. 3.
Figure 5:
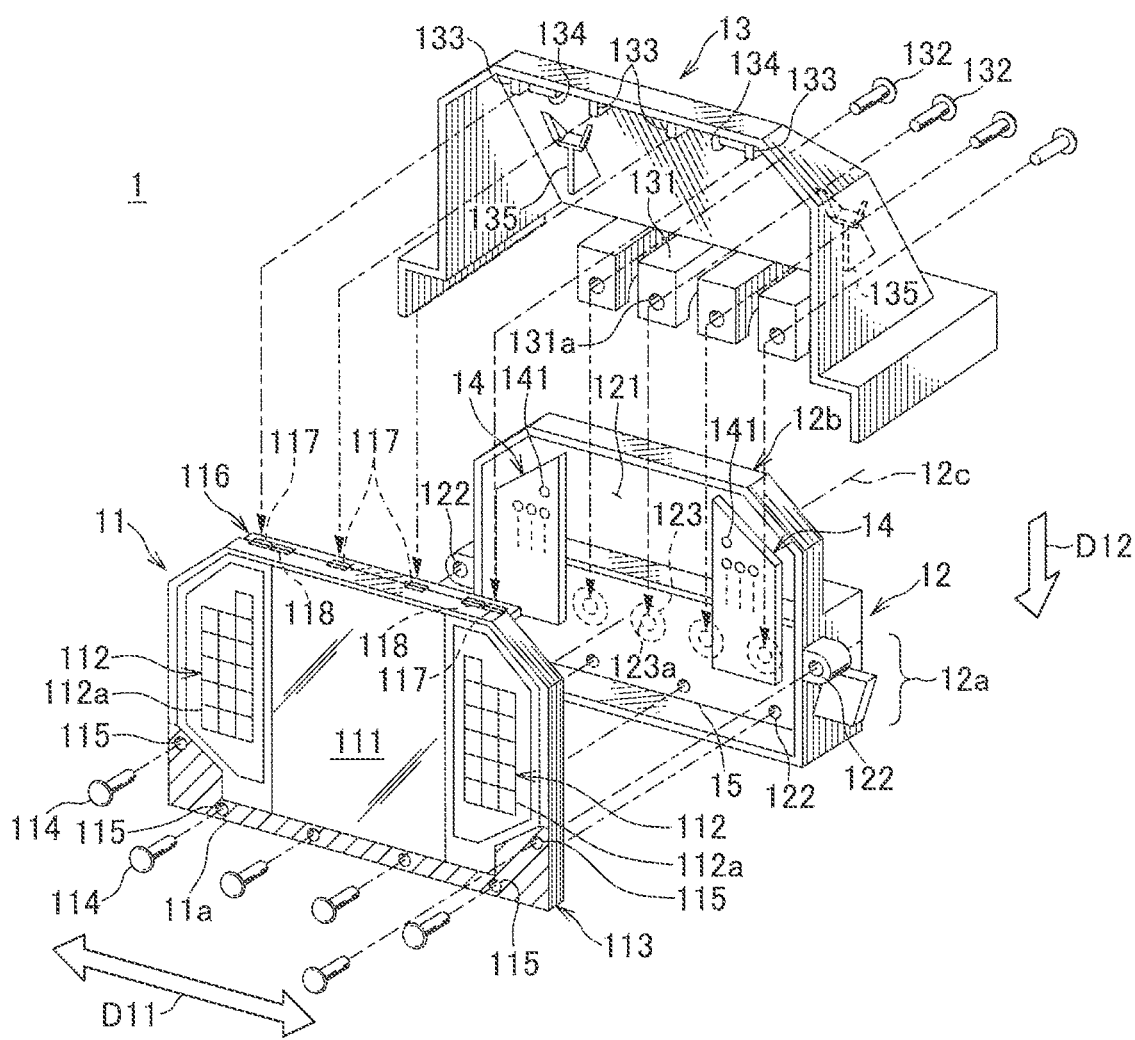
FIG. 5 is a schematic exploded perspective view of the display device shown in FIG. 3 and FIG. 4.

FIG. 3 is a diagram showing a front view and a side view of the display device shown in FIG. 1 and FIG. 2, FIG. 4 is a schematic rear view of the display device shown in FIG. 3, and FIG. 5 is a schematic exploded perspective view of the display device shown in FIG. 3 and FIG. 4.

The display device 1 shown in FIG. 3 to FIG. 5 includes a display panel 11, a device housing 12, a back cover 13, an indicator substrate 14 and a control substrate 15.

The display panel 11 is a panel member in which a liquid crystal screen 111 as a display screen and an indicator region 112 are two-dimensionally arranged and held by a panel frame 113. The liquid crystal screen 111 is configured to display various meter images and various numerical values. The indicator region 112 is a region where a plurality of indicators 112a is two-dimensionally arranged in a lattice shape. Each indicator 112a is a display light configured to display various information by passing the light of a LED light source 141 of the indicator substrate 14 to light up. The display panel 11 is installed in an upright position such that the liquid crystal screen 111 and the indicator region 112 are disposed in front as viewed from an observer. The indicator regions 112 are disposed on a pair of right and left positions shifted from the liquid crystal screen 111 in a right-left direction D11 with respect to said upright position.

The device housing 12 is a flat, bottomed rectangular tube-shaped housing provided with the display panel 11 on an opening side of the device housing 12, and the device housing 12 together with the display panel 11 defines an accommodating space 121 for the indicator substrates 14 and the control substrate 15. As shown in FIG. 1 and FIG. 2, the device housing 12 is installed on the instrument panel C112 in the upright position in a state where a portion of the device housing 12 ranging from a peripheral wall on the lower end side to a back face is hidden as an occulted portion 12a from an observer of the display panel 11.

The display panel 11 is installed so as to cover the opening of the device housing 12, and its lower end side is fixed to the device housing 12 by a plurality of screws 114. A region for the screw fixation at the lower end side of the display panel 11 is a display-side occulted portion 11a which is embedded and hidden in the instrument panel C112 together with the occulted portion 12a of the device housing 12 as shown in FIG. 1 and FIG. 2. A plurality of through holes 115 for screw fixation is formed on the panel frame 113 at a portion corresponding to this display-side occulted portion 11a. In the device housing 12, a plurality of screw holes 122 for screw fixation is formed in the occulted portion 12a on the lower end side at positions facing the through holes 115 of the display panel 11. The lower end side of the display panel 11 is fastened and fixed to the device housing 12 with the screws 114 passed through the through holes 115 and screwed into the screw holes 122. On the other hand, an upper end side of the display panel 11 includes an eave part 116 extending to the back side and extending above the peripheral wall on the upper end side of the device housing 12. The eave part 116 includes engaged parts 117 formed at four locations with which the back cover 13 is engaged, and abutted parts 118 formed at two locations on which the back cover 13 abuts for positioning during the attachment. The abutted parts 118 at two locations are respectively disposed adjacent to and on an inner side with respect to the engaged parts 117 at two locations on the both ends among the engaged parts 117 at four locations aligned in a row.

The back cover 13 is a member which is attached to the device housing 12 so as to cover the back side of the device housing 12 with respect to the side on which the display panel 11 is arranged. The device housing 12 includes a non-occulted portion 12b arranged on the upper end side thereof opposite to the occulted portion 12a with respect to a central axis 12c of the device housing 12 having a bottomed rectangular tube-shape, and the back cover 13 is attached by sliding it in a sliding direction D12 extending from the non-occulted portion 12b to the occulted portion 12a. The back cover 13 is a cover which is shaped such that its lower end side is widened in a skirt shape and which covers an upper side of the occulted portion 12a on the back side of the device housing 12. Further, as shown in FIG. 1 and FIG. 2, the back cover 13 is designed such that it constitutes a design continuous with the instrument panel C112 when the display device 1 is installed on the instrument panel C112.

The fixed parts 123 are formed at four locations on the back face of the occulted portion 12a of the device housing 12 facing the back cover 13, and the back cover 13 is fixed to the fixed parts 123 when it is attached to the device housing 12 by sliding it. Each fixed part 123 is provided with a screw hole 123a. Further, on an inner face of the bottom portion widened in the skirt shape, the back cover 13 includes fixing parts 131 at four locations that protrude inwardly so that their distal ends abut on the fixed parts 123 at four locations of the device housing 12. Each fixing part 131 includes a through hole 131a for screw fixation. The fixing part 131 of the back cover 13 is fastened and fixed to the fixed part 123 of the device housing 12 by the screw 132 passed through the through hole 131a and screwed into the screw hole 123a.

Further, a portion of the back cover 13 corresponding to the non-occulted portion 12b of the device housing 12 is provided with engaging parts 133 at four locations which are configured to engage with the engaged parts 117 at four locations provided on the eave part 116 of the display panel 11 extending above the non-occulted portion 12b. Abutting parts 134 at two locations that are configured to abut on the abutted parts 118 provided on the eave part 116 are respectively disposed on an inner side of and adjacent to the engaging parts 133 at two locations on the both ends among the engaging parts 133 at four locations aligned in a row. The inner face of the back cover 13 is provided with ribs 135 at two locations that are configured to position the fixing parts 131 of the back cover 13 with respect to the fixed parts 123 of the device housing 12 while guiding the sliding in the sliding direction D12 during the attachment to the device housing 12.

The indicator substrate 14 is a trapezoidal plate-shaped substrate mounted with the plurality of LED light sources 141 as light source components. Two indicator substrates 14 are disposed inside the device housing 12 so as to face the indicator regions 112 on the back face side of the display panel 11. Each indicator substrate 14 has a right-angle trapezoidal plate-shape in which lengths of an upper base and a lower base of the trapezoid are greater than a height of the trapezoid, and one side connecting the upper base and lower base is an oblique side, and the other side is orthogonal to the upper base and the lower base. The indicator substrate 14 is disposed in the upright position in which its oblique side faces the non-occulted portion 12b of the device housing 12.

The control substrate 15 is a rectangular substrate which is a separate part from the indicator substrate 14 and on which a control circuit for the liquid crystal screen 111 is formed. One control substrate 15 is disposed inside the device housing 12 at a position further back side of the indicator substrate 14 when viewed from the display panel 11. In this embodiment, the control substrate 15 serves to perform an overall control of the display device 1 including control of the liquid crystal screen 111 and also control of the indicator substrates 14. The control substrate 15 is disposed inside the device housing 12 on the side of the occulted portion 12a and is arranged in a horizontally-oriented position in which a long side of the rectangle is arranged along the right-left direction D11 in the upright position.

Figure 6:
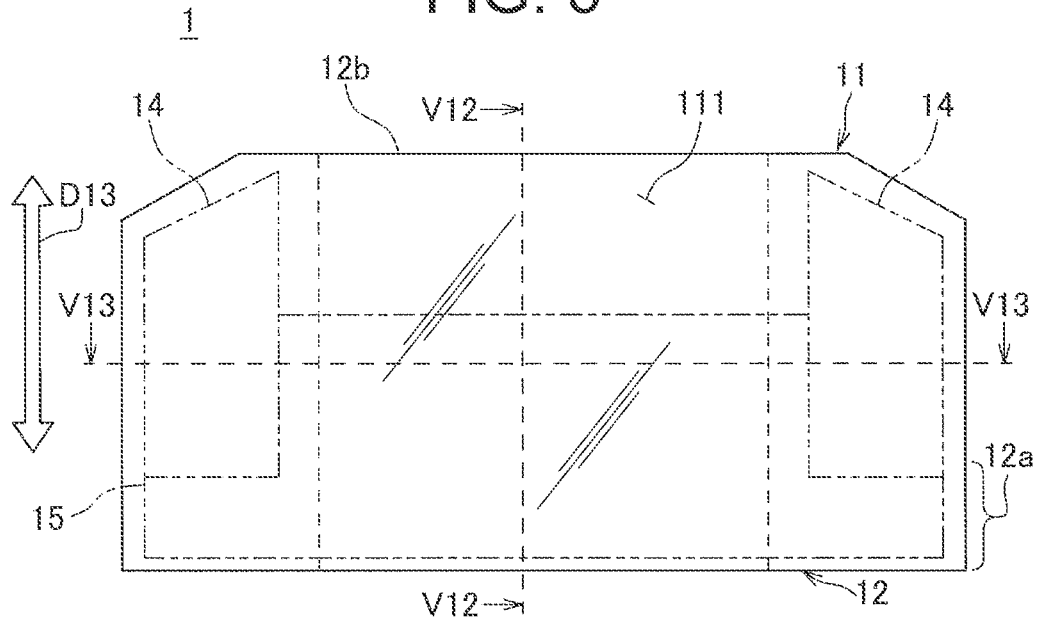
FIG. 6 is a schematic transparent view showing an arrangement of indicator substrates and a control substrate inside the display device shown in FIG. 1 to FIG. 5, viewed from the display panel side.
Figure 7:
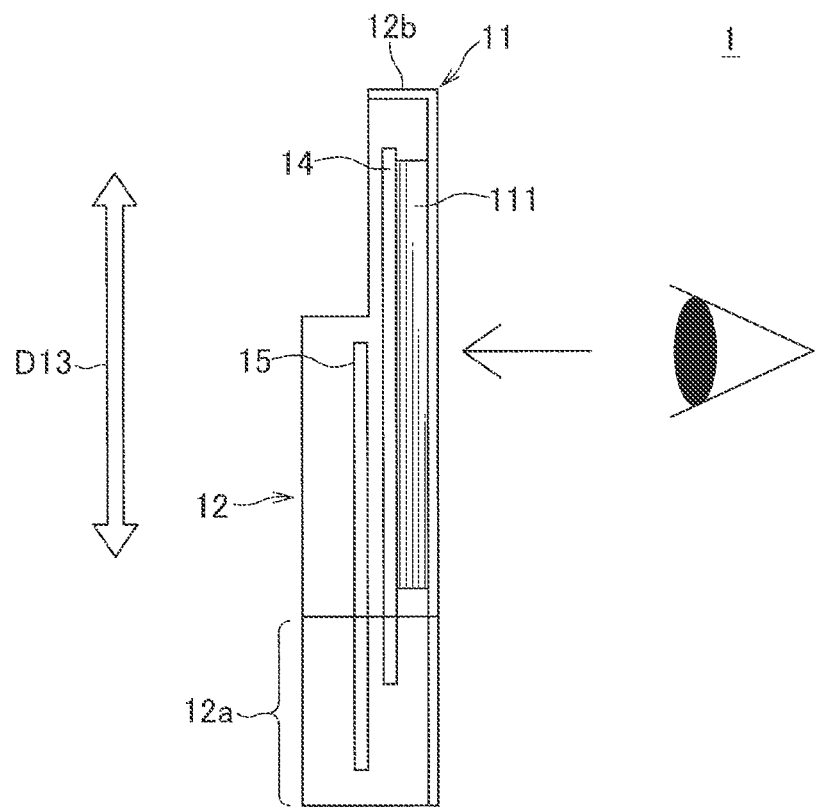
FIG. 7 illustrates an arrangement of the indicator substrate and the control substrate in a schematic longitudinal section of the display device taken along a line V12-V12 in FIG. 6.
Figure 8:
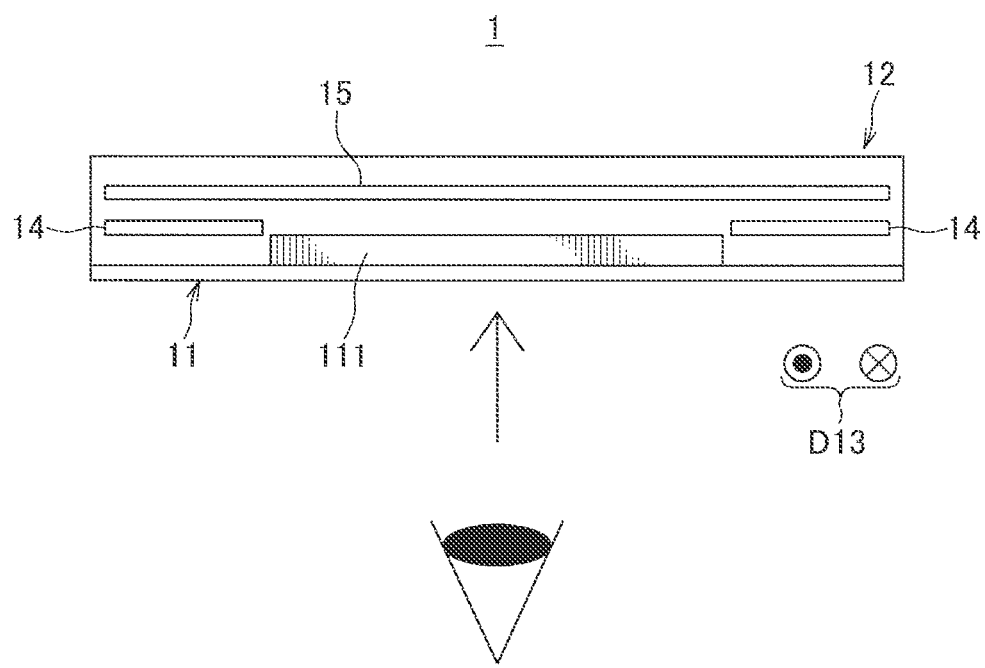
FIG. 8 shows an arrangement of the indicator substrates and the control substrate in a schematic transverse section of the display device taken along a line V13-V13 in FIG. 6.

FIG. 6 is a schematic transparent view showing the arrangement of the indicator substrates and the control substrate inside the display device shown in FIG. 1 to FIG. 5, viewed from the display panel side. FIG. 7 illustrates the arrangement of the indicator substrate and the control substrate in a schematic longitudinal section of the display device taken along a line V12-V12 in FIG. 6. FIG. 8 shows the arrangement of the indicator substrates and the control substrate in a schematic transverse section of the display device taken along a line V13-V13 in FIG. 6. In FIG. 6 to FIG. 8, the back cover 13 is not shown.

As shown in FIG. 6 to FIG. 8, on the back face side of the display panel 11, the control substrate 15 of the display device 1 is arranged further distant from the display panel 11 than the indicator substrate 14 and is arranged so as not to face a portion of each of the liquid crystal screen 111 and the indicator substrates 14. Specifically, the control substrate 15 is arranged so as not to face a portion of an upper end side of each of the liquid crystal screen 111 and the indicator substrates 14 with respect to an up-down direction D13 in the upright position. As a result of this arrangement, on the upper end side in the up-down direction D13 of the device housing 12, i.e., in the non-occulted portion 12b, only the indicator substrates 14 which are nearer the liquid crystal screen 111 than the control substrate 15 are present inside of the device housing 12. Thus, the device housing 12 is formed in a stepped shape in the up-down direction in which the non-occulted portion 12b is thinner compared with the lower end side in the up-down direction D13, i.e., with the side of the occulted portion 12a.

Further, as shown in FIG. 3 and FIG. 5, the back cover 13 is formed into a tapered shape tapered toward the upper side in the side view so as to follow the stepped shape of the device housing 12 in which the non-occulted portion 12b on the upper end side is thinner.

On the other hand, inside of the device housing 12, the lower end sides of the indicator substrates 14 face the control substrate 15. In this embodiment, the control substrate 15 is configured to perform not only the control of the liquid crystal screen 111 but also the control of the indicator substrates 14. In order to perform such control, the indicator substrates 14 and the control substrate 15 are connector connected (i.e., connected via connector connection) to each other at their opposing portions. In this embodiment, in the display panel 11, the indicator regions 112 display information by receiving the light of the LED light sources 141 of the indicator substrates 14 configured to be turned on and off under the control by the control substrate 15, the indicator regions 112 being configured as described below.

Figure 9:
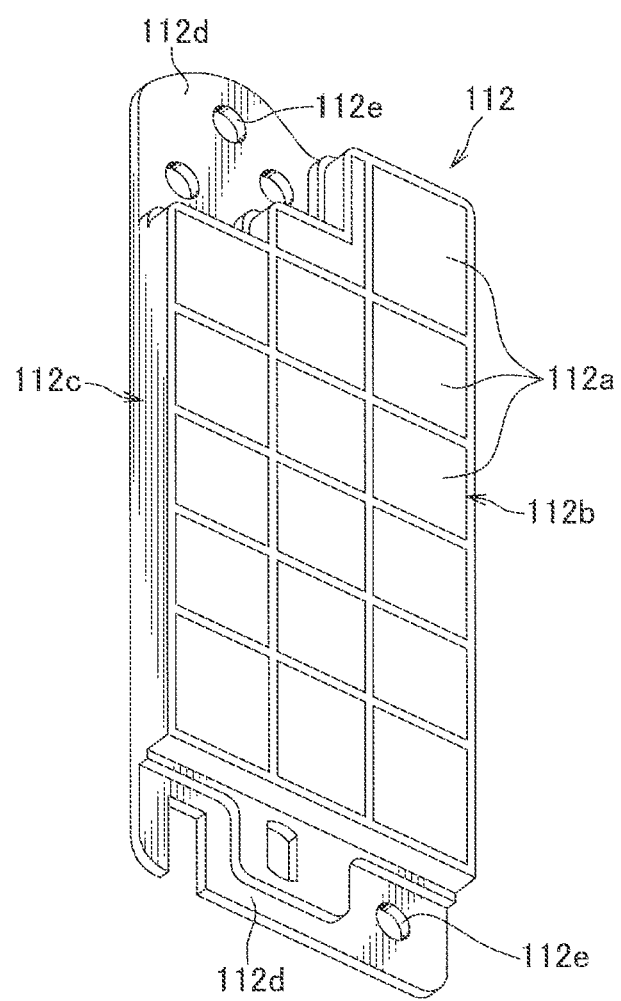
FIG. 9 is a schematic perspective view showing the indicator region of the display panel.

FIG. 9 is a schematic perspective view showing the indicator region of the display panel.

FIG. 9 shows the left indicator region 112 of the right and left pair of the indicator regions 112 of the display panel 11.

As shown in FIG. 9, the indicator region 112 is provided with a diffusing portion 112b and a blocking portion 112c. The diffusing portion 112b is formed by a group of indicators 112a that are two-dimensionally arranged in a lattice shape, and the diffusing portion 112b passes the light of the LED light sources 141 while diffusing it. The blocking portion 112c is a portion formed so as to surround the diffusing portion 112b to block various stray lights and including a fixing flange 112d for fixing the indicator region 112 to the panel frame 113. The fixing flange 112d of the blocking portion 112c includes a plurality of through holes 112e for screw fixation. In this embodiment, in the indicator region 112, the diffusing portion 112b and the blocking portion 112b are formed integrally by two-color molding using a milky-colored resin that diffuses light and an opaque resin that blocks light.

According to the above-described substrate structure of the display device 1 of this embodiment, advantageous effects as described below can be provided.

That is, according to the display device 1 described above, the control substrate 15 and the indicator substrates 14, which correspond respectively to the liquid crystal screen 111 and the indicator regions 112 that are two-dimensionally arranged on the display panel 11, are provided separately from each other. Further, the control substrate 15 positioned farther from the display panel 11 than the indicator substrates 14 is arranged so as not to face a portion of each of the liquid crystal screen 111 and the indicator substrates 14. Thus, for the region of the non-occulted portion 12b where the control substrate 15 is not facing each of the liquid crystal screen 111 and the indicator substrates 14, there is no increase in a thickness by the control substrate 15, thus the thickness of the display device 1 can be reduced. That is, according to this embodiment, it is possible to reduce the thickness of the display device 1 for at least a portion thereof.

In this embodiment, the display panel 11 is configured to be installed in the upright position, and the indicator regions 112 of the display panel 11 are disposed at a position shifted from the liquid crystal screen 111 in the right-left direction D11 with respect to the upright position. In addition, the control substrate 15 is disposed so as not to face a portion of the upper end side of each of the liquid crystal screen 111 and the indicator substrates 14 with respect to the up-down direction D13 in the upright position. According to this configuration, with respect to the display device 1 in the upright position, it is possible to reduce the thickness of the partial region on the upper end side of each of the liquid crystal screen 111 and the indicator substrates 14 with which the control substrate 15 does not face, as shown in FIG. 7. In this embodiment, this region on the upper end side which can be made thinner can be used as a protruding portion in the case where a portion of the display device 1 protrude from the instrument panel C112 as shown in FIG. 1 and FIG. 2. That is, according to the above-described configuration, it is possible to improve the appearance of the display device 1 when it is put in the protruded arrangement as described above.

Further, in this embodiment, the indicator substrates 14 and the control substrate 15 are connector connected to each other. According to this configuration, as compared with the case where the indicator substrates 14 and the control substrate 15 are cable connected (i.e., connected via connector connection), it is possible to reduce the space required for connecting the substrates and this is preferable.

Further, in this embodiment, the display device 1 includes the device housing 12 that together with the display panel 11 defines the accommodating space 121 for the indicator substrates 14 and the control substrate 15. According to this configuration, the indicator substrates 14 and the control substrate 15 are accommodated in the device housing 12 together, thus the number of components related to the housing can be reduced, and this is preferable.

Further, in this embodiment, for the indicator region 112 in the display panel 11, the diffusing portion 112b passing the light from the LED light sources 141 while diffusing it and the blocking portion 112c surrounding the diffusing portion 112b to block the light are formed integrally by two-color molding. According to this configuration, light leakage and luminance unevenness in the indicator region 112 can be suppressed as compared with the case where the diffusing portion 112b and the blocking portion 112c are formed as the separate parts, thus the thickness of the display device 1 including the indicator regions 112, i.e., the display panel 11, can be reduced further, and this is preferable.

We pause the explanation of the display device 1 of the embodiment shown in FIG. 1 to FIG. 9, and will describe several modified examples with respect to this embodiment.

Figure 10:
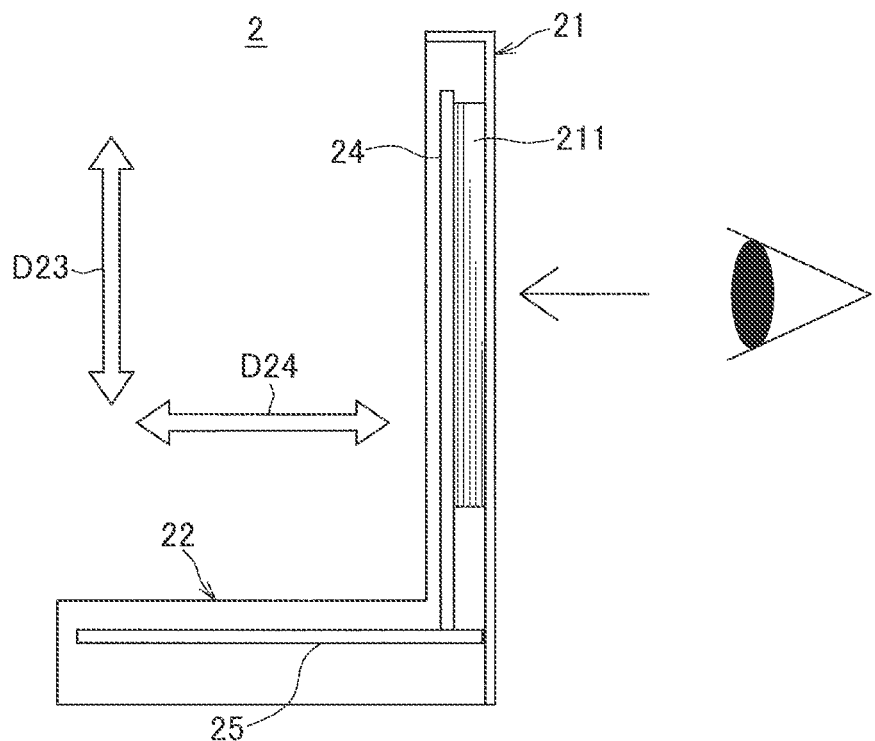
FIG. 10 is a schematic diagram showing a display device of a first modified example in an orthogonal cross-section with respect to a display panel.

FIG. 10 is a schematic diagram showing a display device of the first modified example in an orthogonal cross-section with respect to the display panel.

In the display device 2 of the first modified example, a control substrate 25 is disposed such that it is entirely not facing each of a liquid crystal screen 211 and indicator substrates 24 of a display panel 21. Specifically, the control substrate 25 is disposed on the lower end side of the indicator substrate 24 with respect to an up-down direction D23 in the upright position, such that the control substrate 25 is arranged along an intersecting direction D24 with respect to the indicator substrates 24. With this substrate arrangement, the indicator substrates 24 and the control substrate 25 form an L-shape in the cross-sectional view as shown in FIG. 10, and a device housing 22 accommodating the indicator substrates 24 and the control substrate 25 is also an L-shaped housing. Further, in this first modified example also, the indicator substrates 24 and the control substrate 25 are connector connected to each other.

In the configuration of the above-described first modified example also, it is possible to reduce the thickness of the display device 2 for at least a portion thereof as in the case of the above-described embodiment.

Further, according to the configuration of the first modified example, each of the liquid crystal screen 211 and the indicator substrates 24 of the display panel 21 in the upright position is entirely not facing the control substrate 25, thus it is possible to reduce the thickness of the entire part corresponding to the display panel 21.

Figure 11:
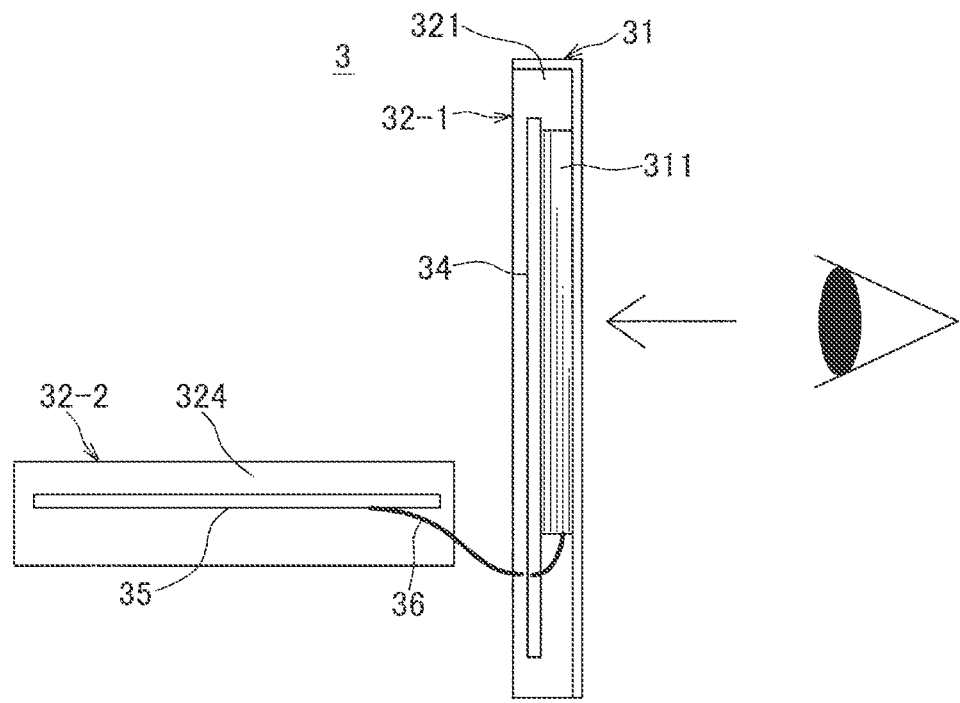
FIG. 11 is a schematic diagram showing a display device of a second modified example in an orthogonal cross-section with respect to a display panel.

FIG. 11 is a schematic diagram showing a display device of the second modified example in an orthogonal cross-section with respect to the display panel.

A display device 3 of the second modified example includes two housings, namely a first device housing 32-1 and a second device housing 32-2. The first device housing 32-1 is a flat, bottomed rectangular tube-shaped housing which together with a display panel 31 defines a first accommodating space 321 for accommodating an indicator substrate 34. The second device housing 32-2 is a flat, bottomed rectangular tube-shaped housing which is disposed on the back side of the first device housing 32-1 and which defines a second accommodating space 324 for accommodating the control substrate 35.

In the second modified example, unlike the above-described embodiment and the first modified example, the indicator substrate 34 is a self-control type substrate mounted with a control circuit that performs on-off control of the mounted light sources. Further, the control substrate 35 is a dedicated substrate that performs only the control of a liquid crystal screen 311 of the display panel 31. Further, in this second modified example, the display device 3 includes a connecting cable 36 that electrically connects the liquid crystal screen 311 of the display panel 31 defining the first accommodating space 321 to the control substrate 35 accommodated in the second accommodating space 324.

Figure 12:
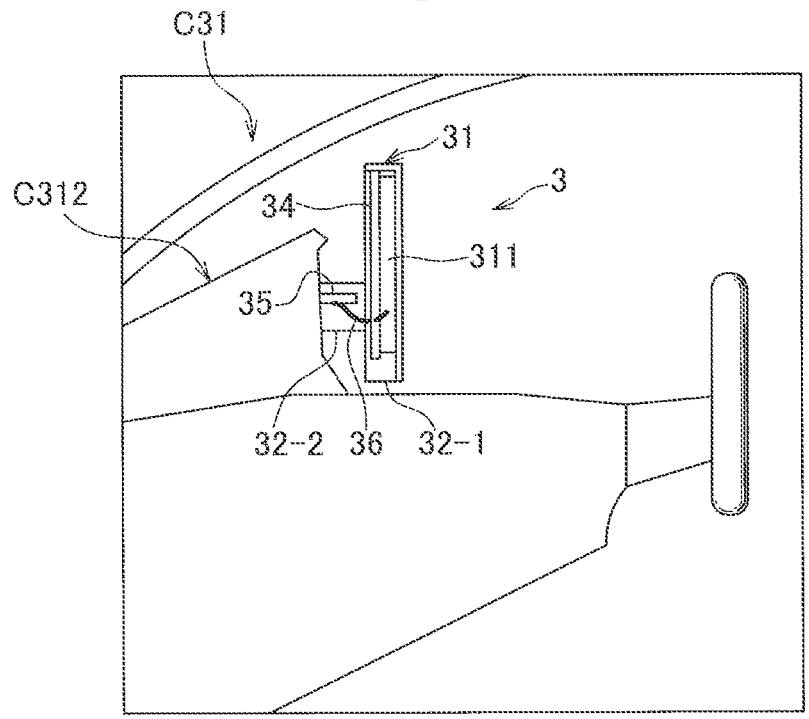
FIG. 12 is a schematic diagram showing one installation example for installing the display device of the second modified example in a vehicle.

FIG. 12 is a schematic diagram showing one installation example for installing the display device of the second modified example in a vehicle.

In the installation example shown in FIG. 12, the display device 3 is disposed in front of the driver's seat in a vehicle C31 as if the display panel 31 is floating. In this installation example, the second device housing 32-2 accommodating the control substrate 35 supports, from the back side, the first device housing 32-1 which accommodates the indicator substrates 34 and to which the display panel 31 is fixed. That is, one end edge of the second device housing 32-2 is fixed to the back face of the first device housing 32-1, and the other end edge is embedded and fixed to the instrument panel C312 as the installation place. The connecting cable 36 is wired from the control substrate 35 through the junction of the first device housing 32-1 and the second device housing 32-2 to the liquid crystal screen 311.

In the configuration of the above-described second modified example also, it is possible to reduce the thickness of the display device 3 for at least a portion thereof as in the case of the above-described embodiment.

Further, according to the configuration of the second modified example, the control substrate 35 is accommodated in the second device housing 32-2 that is a separate part from the first device housing 32-1 defining the accommodating space for the indicator substrates 34 together with the display panel 31 viewed by an observer. According to this configuration in which the housings are formed as separate parts, it is possible to reduce the entire thickness of the housing that is viewed by an observer.

In addition, the second modified example is further provided with the connecting cable 36 that electrically connects the indicator substrates 34 accommodated in the first accommodating space 321 and the control substrate 35 accommodated in the second accommodating space 324. According to this configuration, it is possible to improve the degree of freedom for the design of installation of the display device 3, such as to place the first device housing 32-1 and the second device housing 32-2 distant from each other, in addition to the installation example shown in FIG. 12.

The description of the first and second modified examples ends here, and now we return to the explanation of the embodiment shown in FIG. 1 to FIG. 9.

As illustrated schematically with reference to FIG. 3 to FIG. 5, in the display device 1 of this embodiment, the back cover 13 is attached by sliding it so as to cover the back side of the device housing 12. The fixed parts 123 at four locations are formed on the back face of the device housing 12, and the fixing parts 131 at four locations are formed on the back cover 13.

Figure 13:
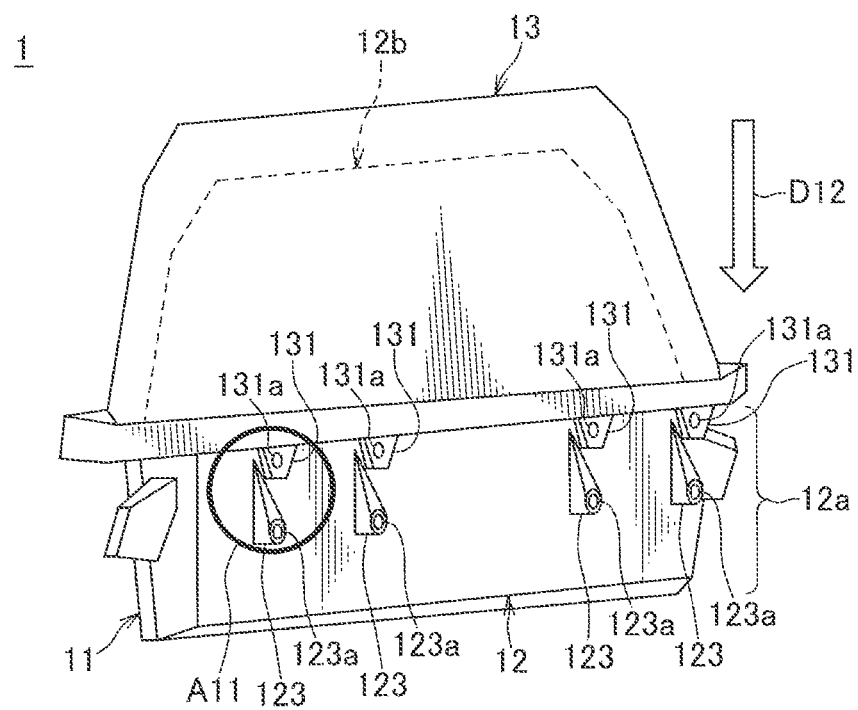
FIG. 13 is a perspective view of a device housing viewed from a back side thereof, illustrating how a back cover is attached by sliding it so as to cover the back side of the device housing.
Figure 14:
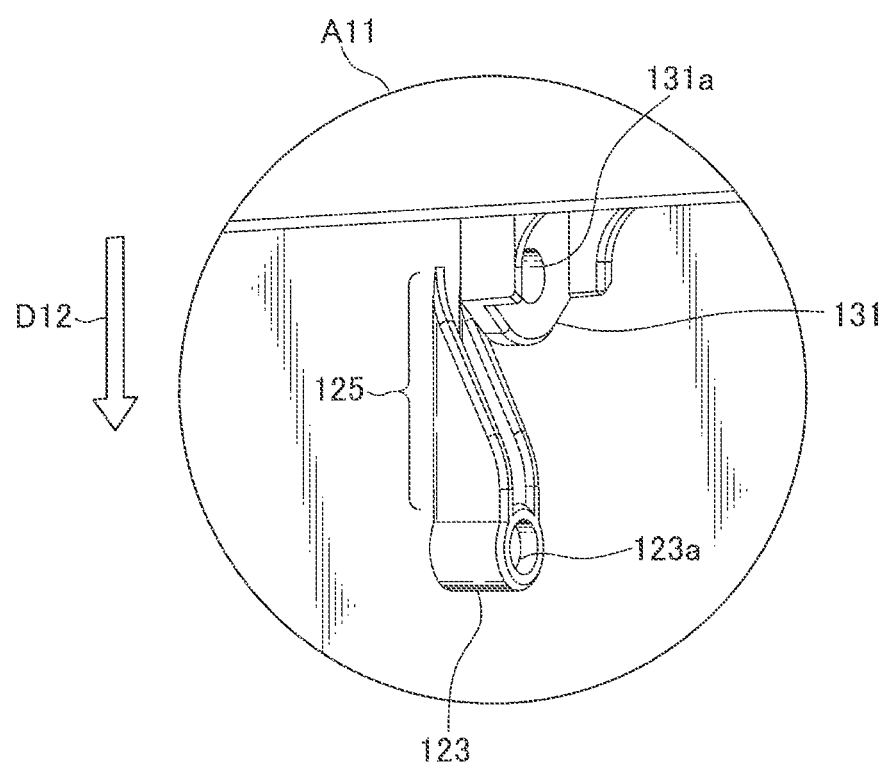
FIG. 14 is an enlarged view of a region A11 shown in FIG. 13.

FIG. 13 is a perspective view of the device housing viewed from the back side thereof, illustrating how the back cover is attached by sliding it so as to cover the back side of the device housing. FIG. 14 is an enlarged view of a region A11 shown in FIG. 13.

Again, in the display device 1 of this embodiment, the back cover 13 is attached so as to cover the back side of the device housing 12 with respect to the side on which the display panel 11 is arranged. The back cover 13 is attached by sliding it in the sliding direction D12 from the non-occulted portion 12b on the upper end side of the device housing 12 in the upright position toward the occulted portion 12a on the lower end side. That is, in this embodiment, the back cover 13 corresponds to a slide attaching part which is attached to the device housing 12 by the sliding. The structure constituted of the display panel 11 and the device housing 12 corresponds to a slide receiving part, the slide receiving part including the device housing 12 but excluding the slide attaching part.

For the back cover 13, the through holes 131a of the fixing parts 131 at four locations are moved to slide to a position where they overlap the screw holes 123a of the fixed parts 123 at four locations provided on the back face of the occulted portion 12a of the device housing 12. As shown in FIG. 14, the fixed part 123 is formed as a boss which protrudes in a cylindrical shape and inside of which is the screw hole 123a. The back face of the device housing 12 as the slide receiving part is provided with guide slopes 125, the guide slope 125 being provided one for each fixed part 123 and configured to guide the fixing part 131 to a distal end face of the boss as the fixed part 123 during the attachment of the back cover 13 as the slide attaching part. The guide slope 125 is a slope portion arranged adjacent to the boss as the fixed part 123, which extends in the sliding direction D12 toward the distal end face of the boss where the screw hole 123a opens and which has a height that gradually increases with respect to the sliding direction D12.

Further, as briefly described with reference to FIG. 5, the inner face of the back cover 13 is provided with the ribs 135 at two locations configured to position the fixing parts 131 of the back cover 13 with respect to the fixed parts 123 of the device housing 12 while guiding the sliding in the sliding direction D12. In the following, the configuration of the rib 135 is described in detail.

Figure 15:
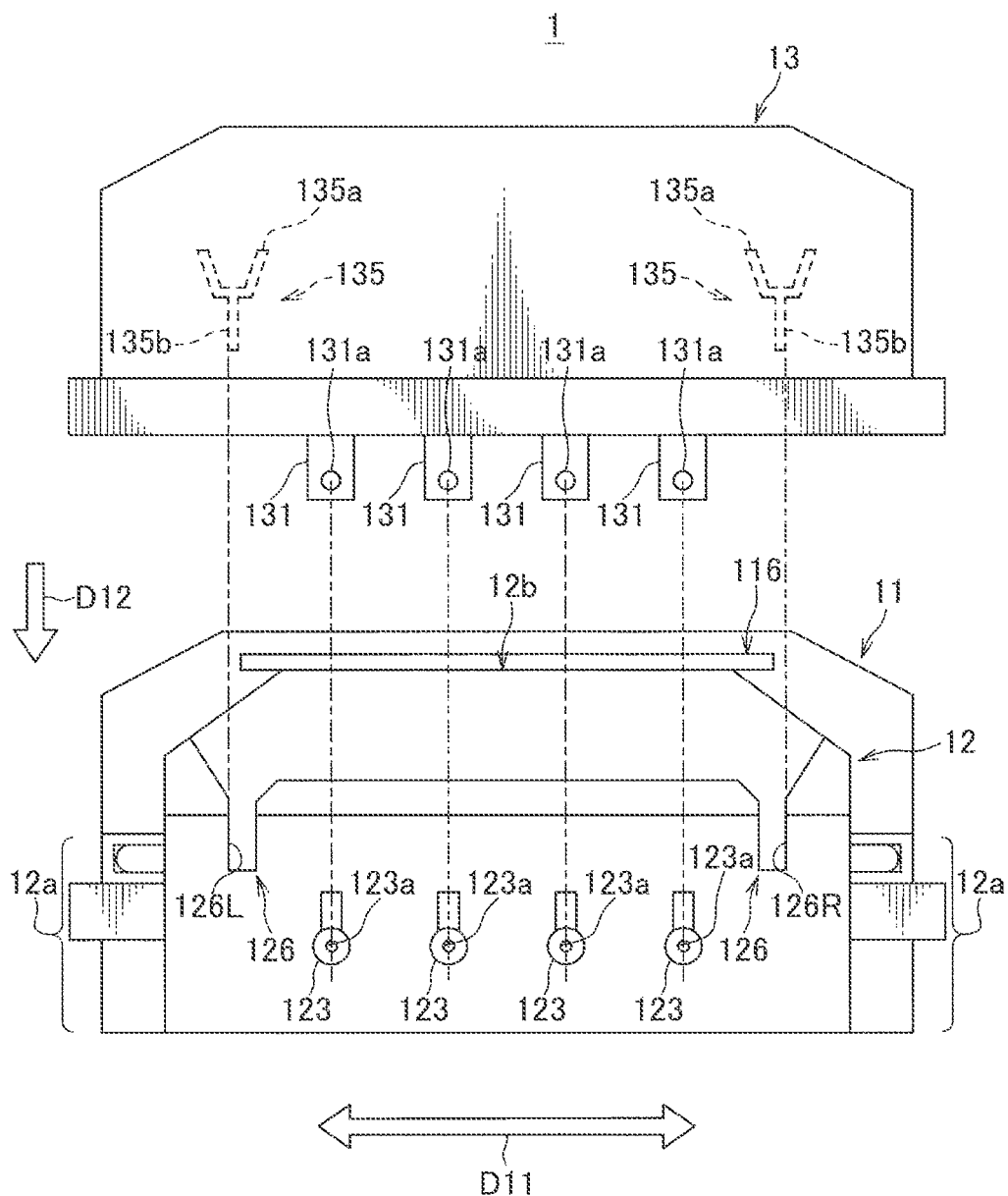
FIG. 15 is a schematic diagram of the display device seen from the back face side thereof, illustrating how ribs of the back cover shown in FIG. 5 guide the sliding of the back cover and position fixing parts of the back cover with respect to fixed parts of the device housing.

FIG. 15 is a schematic diagram of the display device seen from the back face side thereof, illustrating how the ribs of the back cover shown in FIG. 5 guide the sliding of the back cover and position the fixing parts of the back cover with respect to the fixed parts of the device housing.

As shown in FIG. 5 and FIG. 15, the rib 135 includes an eave-shaped rib 135a protruding in a U-shape in a front view from the inner face of the back cover 13, and a rib body 135b formed so as to extend in the sliding direction D12 from an outer bottom face of the eave-shaped rib 135a. The ribs 135 are provided at positions nearer the both ends in the right-left direction D11 of the inner face of the back cover 13 and on the out side of the fixing parts 131 at four locations aligned in a row.

On the other hand, the back face of the device housing 12 is provided with positioning rails 126 for receiving the rib bodies 135b of the ribs 135 which are formed at two locations on a boundary portion between a thinned portion of the non-occulted portion 12b on the upper end side and a thick portion on the side of the occulted portion 12a below the thinned portion. Each positioning rail 126 extends in the sliding direction D12 to receive the rib body 135b during the attachment of the back cover 13 in order to position the fixing part 131 of the back cover 13 with respect to the fixed part 123. Each positioning rail 126 is a groove portion opening such that, on the side of the groove portion from which the rib body 135b is received during the attachment of the back cover 13 of the display device 1, the groove portion opens wider than the rest of the portion. Further, the positioning rails 126 at two locations are provided at positions nearer the both ends in the right-left direction D11 of the back face of the device housing 12 and on the out side of the fixed parts 123 at four locations aligned in a row.

Figure 16:
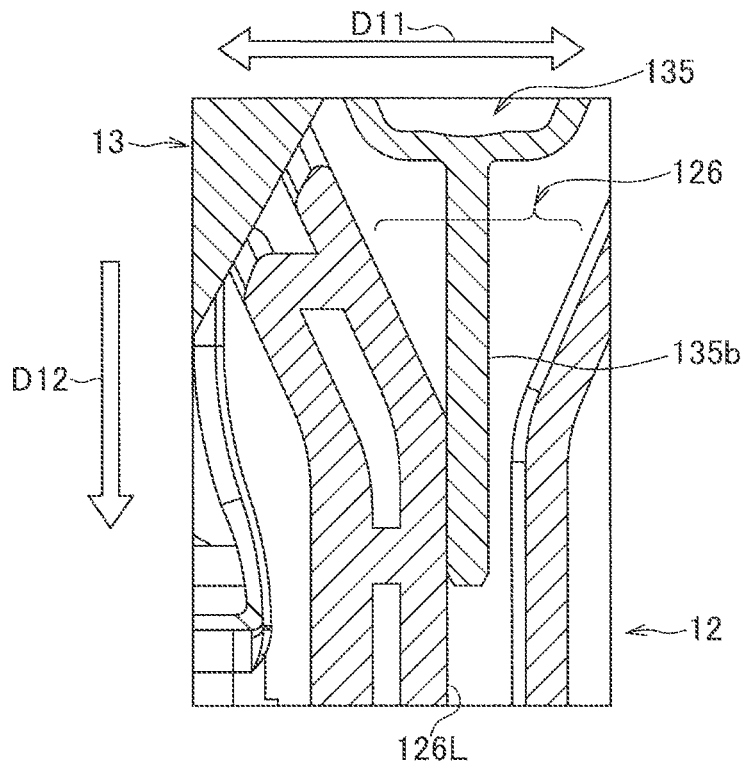
FIG. 16 shows a cross-section along a groove bottom face, showing a state where a rib body of the left rib is received in the left positioning rail shown in FIG. 15 among positioning rails at two locations shown in FIG. 15.

FIG. 16 shows a cross-section along the groove bottom face, showing a state where the rib body of the left rib is received in the left positioning rail shown in FIG. 15 among the positioning rails at two locations shown in FIG. 15. Further, FIG. 17 is a cross-section along the groove bottom face, showing a state where the rib body of the right rib is received in the right positioning rail shown in FIG. 15 among the positioning rails at two locations shown in FIG. 15.

Figure 17:
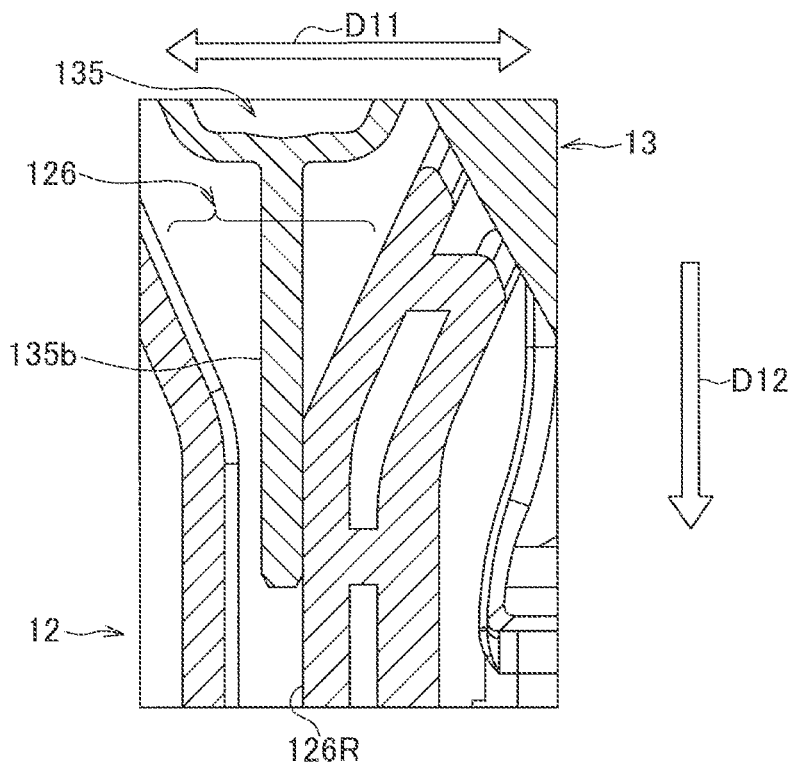
FIG. 17 is a cross-section along the groove bottom face, showing a state where a rib body of the right rib is received in the right positioning rail shown in FIG. 15 among the positioning rails at two locations shown in FIG. 15.

As shown in FIG. 15 to FIG. 17, the rib body 135b of the left rib 135 is received so as to abut on a left inner face 126L of the opposing pair of inner faces of the left positioning rail 126. On the other hand, the rib body 135b of the right rib 135 is received so as to abut on a right inner face 126R of the pair of inner faces of the right positioning rail 126. As a result of such receiving configuration, the back cover 13 slides in the sliding direction D12 in a state where the relative position thereof in the right-left direction D11 with respect to the device housing 12 is uniquely positioned. Both of the back cover 13 and the device housing 12 include the fixing parts 131 and the fixed parts 123, respectively, that are formed at positions corresponding to such unique relative positional relationship. As a result, when the back cover 13 is moved to slide in a state where the rib bodies 135b of the left and right ribs 135 are received in the left and right positioning rails 126, the fixing parts 131 are positioned relative to the fixed parts 123. More specifically, the through holes 131a of the fixing parts 131 are positioned so as to communicate with the screw holes 123a of the fixed parts 123.

In this embodiment, as shown in FIG. 15, the back cover 13 as the slide attaching part is attached with respect to the structure as the slide receiving part in which the display panel 11 is attached to the device housing 12. In this slide receiving part, the eave part 116 formed on the upper end side of the back face of the display panel 11 extends above the peripheral wall on the upper end side of the device housing 12. In addition, as briefly described with reference to FIG. 5, the eave part 116 is provided with the engaged parts 117 at four locations with which the back cover 13 is engaged, and the abutted parts 118 at two locations on which the back cover 13 abuts. Further, on the upper end side of the back cover 13, there are provided the engaging parts 133 at four locations which engage with the engaged parts 117 at four locations provided on the eave part 116 of the display panel 11, and the abutting parts 134 at two locations which abut on the abutted parts 118.

Figure 18:
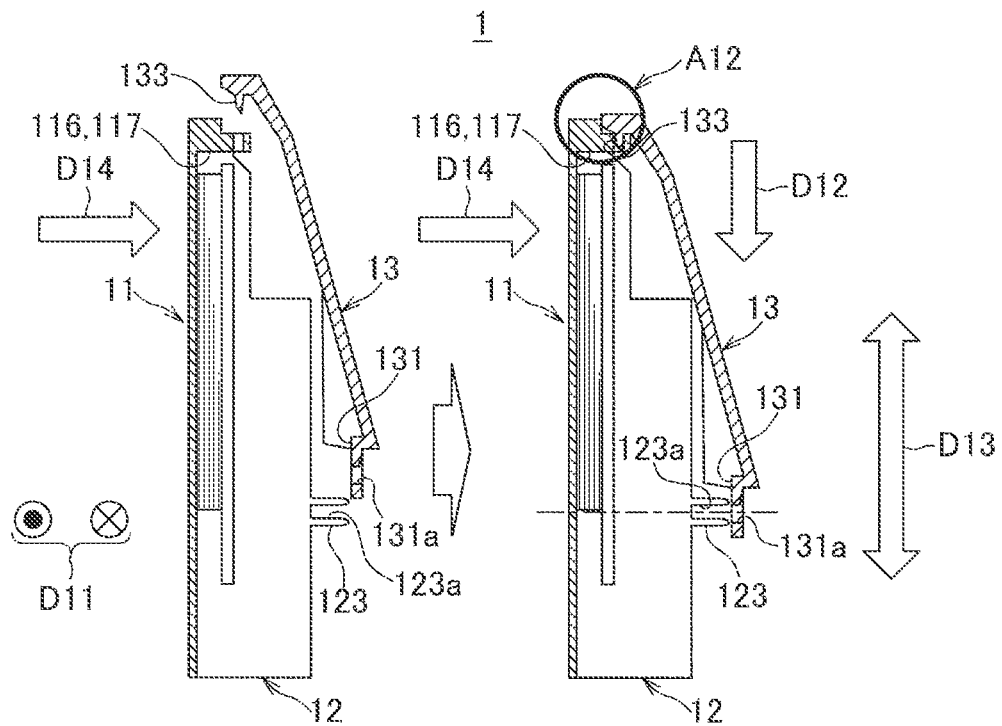
FIG. 18 shows a longitudinal section along an up-down direction of an upright position, showing how engaging parts of the back cover engage with engaged parts of the display panel.
Figure 19:
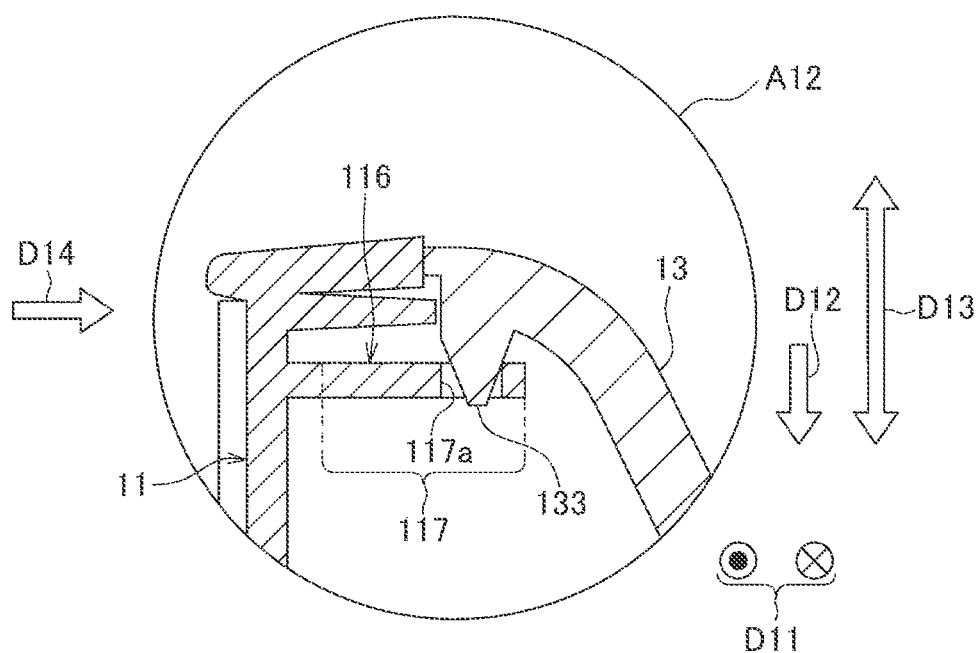
FIG. 19 is an enlarged view of a region A12 surrounding the engaging parts and the engaged parts in FIG. 18.

FIG. 18 shows a longitudinal section along the up-down direction of the upright position, showing how the engaging parts of the back cover engage with the engaged parts of the display panel, and FIG. 19 is an enlarged view of a region A12 surrounding the engaging parts and the engaged parts in FIG. 18.

Figure 23:
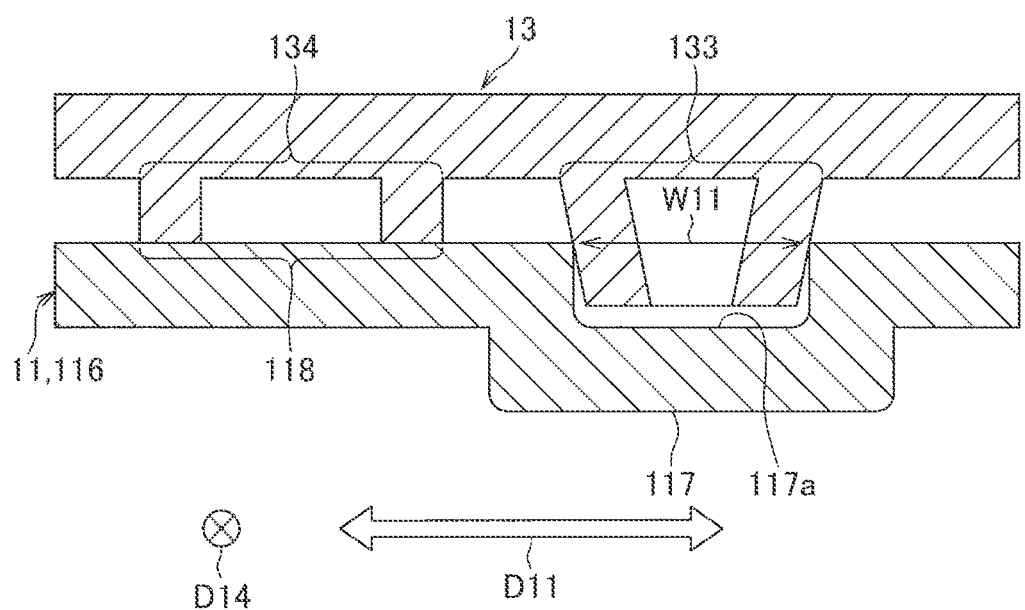
FIG. 23 is an enlarged transverse section along the right-left direction showing the engaging part, the engaged part, the abutting part and the abutted part, illustrating a state in which the engaging part of the back cover shown in FIG. 22 is engaged with the engaged part of the display panel and the abutting part of the back cover is abutted on the abutted part of the display panel.

As shown in FIG. 18, when assembling the display device 1, as the back cover 13 is slid in the sliding direction D12, the through holes 131a of the fixing parts 131 communicate with the screw holes 123a of the fixed parts 123 of the device housing 12 on the lower end side in the up-down direction D13. On the other hand, on the upper end side, the engaging parts 133 engage with the engaged parts 117 provided on the eave part 116 of the display panel 11, as shown in FIG. 18 and FIG. 19. The engaged part 117 of the display panel 11 is a small region on the eave part 116 where an engaging hole 117a or an engaging recess 117b is provided. As described above, the eave part 116 of the display panel 11 is provided with the engaged parts 117 at four locations that are aligned in a row in the right-left direction D11. Among the engaged parts 117 at four locations, the engaged parts 117 at two locations on the both ends are provided with the engaging recesses 117b, and the engaged parts 117 at two locations nearer the center are provided with the engaging holes 117a. The engaged part 117 provided with the engaging hole 117a is shown in FIG. 18 and FIG. 19, and the engaging recess 117b is shown in FIG. 23 described later.

The engaging part 133 on the back cover 13 is an engaging claw configured to be fitted into and engaged with the engaging hole 117a or the engaging recess 117b. This engaging claw as the engaging part 133 is formed such that its cross-sectional shape of the longitudinal section along the sliding direction D12 and intersecting the back cover 13 is a tapered shape tapered toward the distal end. On the other hand, the shape of the engaging claw as the engaging part 133 as viewed from a plan-view direction D14 with respect to the back cover 13 is a press-fit shape which will be described later with reference to FIG. 23 and FIG. 24.

In this embodiment, the movement of the back cover 13 is restricted when the back cover 13 reaches the attachment position where the fixing parts 131 overlap the fixed parts 123 such that the through holes 131a communicate with the screw holes 123a. This restriction of movement is performed by the abutting parts 134 of the back cover 13 abutting on the abutted parts 118 of the display panel 11.

Figure 20:
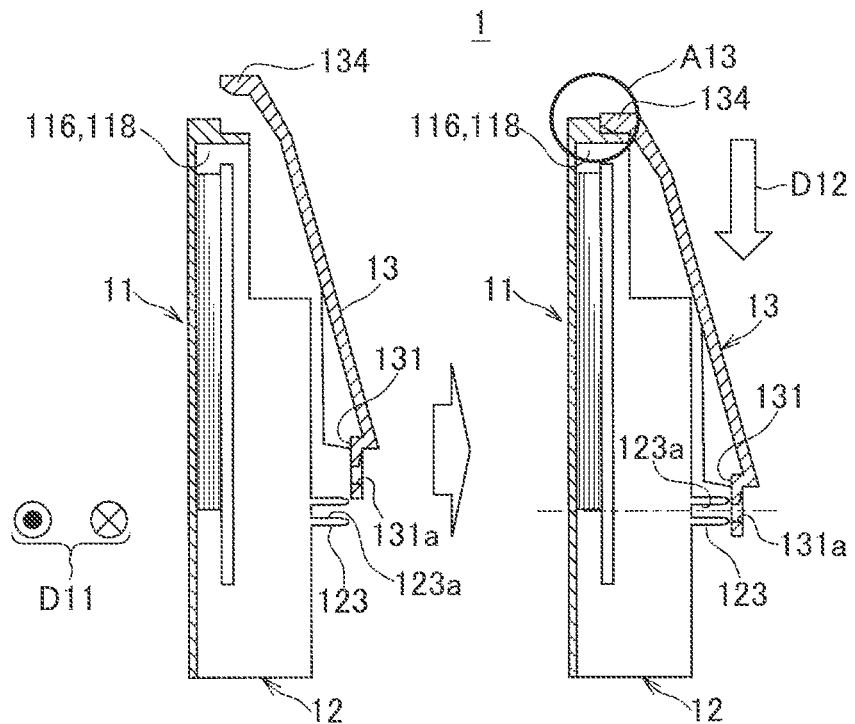
FIG. 20 shows, in a longitudinal section similar to FIG. 18, how movement of the back cover is restricted by abutting parts of the back cover abutting on abutted parts of the display panel.
Figure 21:
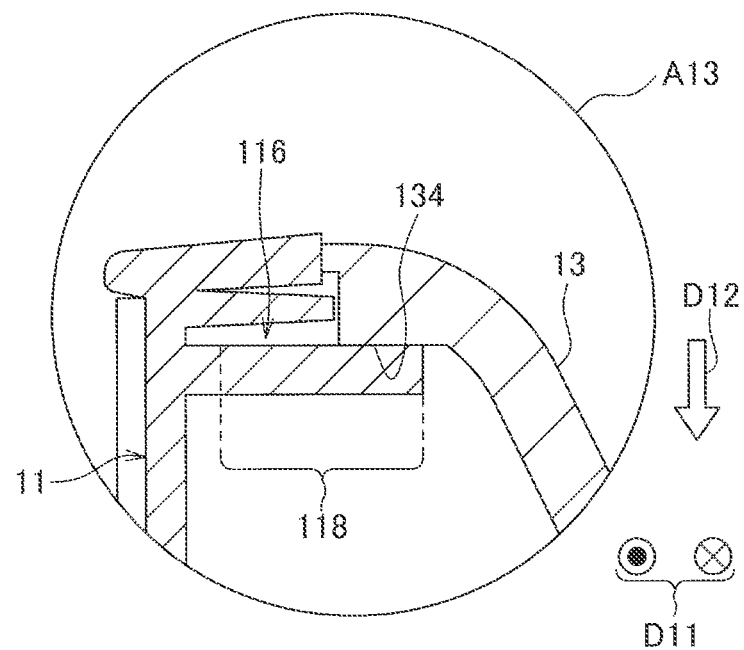
FIG. 21 is an enlarged view of a region A13 shown in FIG. 20 surrounding the engaging part and the engaged part.

FIG. 20 shows, in a longitudinal section similar to FIG. 18, how the movement of the back cover is restricted by the abutting parts of the back cover abutting on the abutted parts of the display panel, and FIG. 21 is an enlarged view of a region A13 shown in FIG. 20 surrounding the engaging part and the engaged part.

The abutted part 118 of the display panel 11 in the display device 1 is a portion on which the abutting part 134 abuts when the back cover 13 reaches the attachment position where the fixing parts 131 overlap with the fixed parts 123 such that the through holes 131a communicate with the screw holes 123a. With the abutting parts 134 abutting on the abutted parts 118, the abutted parts 118 restrict the movement of the back cover 13 exceeding the attachment position described above. This restriction of movement maintains the communication between the through holes 131a and the screw holes 123a. The abutted part 118 is a small region on the eave part 116 of the display panel 11 on which the abutting part 134 abuts. On the other hand, the abutting part 134 of the back cover 13 is a protruded part protruding in the sliding direction D12 from the inner face on the upper end side of the back cover 13 and protruding for a protruding amount that the back cover 13 abuts on the abutted parts 118 of the eave part 116 when the back cover 13 reaches the attachment position described above.

Further, in this embodiment, the abutted parts 118 are provided adjacent to the engaged parts 117 in the eave part 116 of the display panel 11. Further, on the inner face of the back cover 13, the abutting part 134 is provided adjacent to the engaging part 133.

First, as shown in FIG. 5, the upper end side portion of the inner face of the back cover 13 corresponding to the non-occulted portion 12b of the device housing 12 is provided with the engaging parts 133 at four locations that are aligned in a row in the right-left direction D11. The abutting parts 134 of the back cover 13 are provided at two locations adjacent to, within said alignment, each of the engaging parts 133 at two locations on both ends among the engaging parts 133 at four locations.

Figure 22:
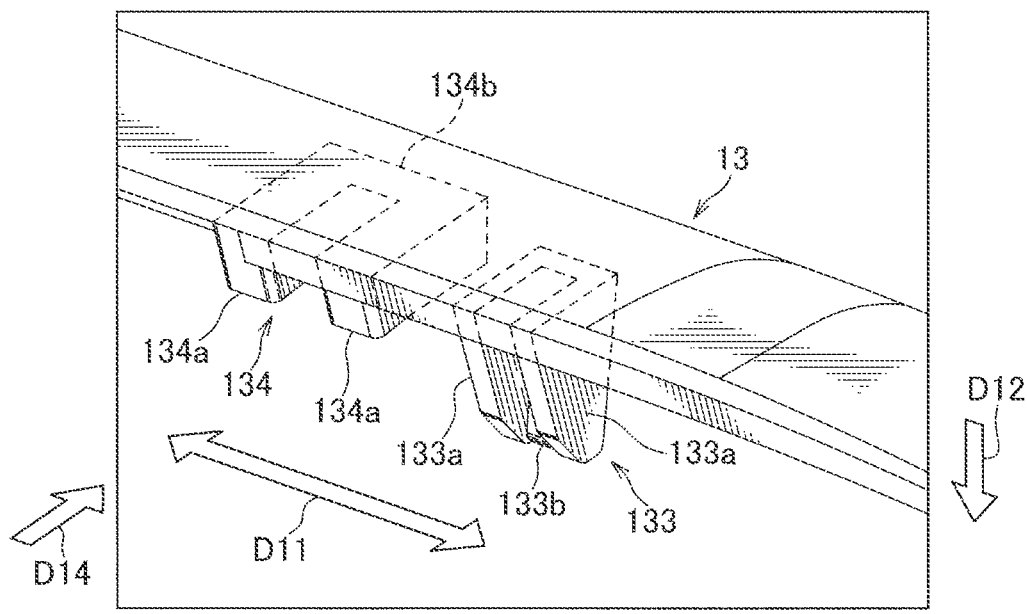
FIG. 22 is an enlarged perspective view of the engaging part and the abutting part provided adjacent to each other on an inner face of the back cover.

FIG. 22 is an enlarged perspective view of the engaging part and the abutting part provided adjacent to each other on the inner face of the back cover. The enlarged region shown in FIG. 22 corresponds to a corner portion located on the upper right end side in the right-left direction D11 of the back cover 13 when the back cover 13 is viewed from the side of the display panel 11.

As shown in FIG. 22, the engaging part 133 of the back cover 13 includes a pair of claw ribs 133a and a connecting rib 133b. The pair of claw ribs 133a are rib portions each having a tapered shape shown in FIG. 19 and arranged to face each other in the right-left direction D11. Further, the connecting rib 133b is a rib portion that connects the pair of claw ribs 133a in the right-left direction D11 in a back side of the back cover 13. The adjacent abutting part 134 on the inner side with respect to this engaging part 133 has the similar shape and thus includes a pair of abutting ribs 134a and a connecting rib 134b. The pair of abutting ribs 134a is rib portions provided so as to face each other in the right-left direction D11 and each protruding in the sliding direction D12 for the protruding amount that it abuts on the abutted part 118 of the display panel 11 when it is in the attachment position described with reference to FIG. 18 and FIG. 20. Further, the connecting rib 134b is a rib portion that connects the pair of abutting ribs 134a in the right-left direction D11 in a back side of the back cover 13.

FIG. 23 is an enlarged transverse section along the right-left direction showing the engaging part, the engaged part, the abutting part and the abutted part, illustrating a state in which the engaging part of the back cover shown in FIG. 22 is engaged with the engaged part of the display panel, and the abutting part of the back cover is abutted on the abutted part of the display panel.

As shown in FIG. 23, when the back cover 13 reaches the attachment position described above, the engaging part 133 of the back cover 13 engages with the engaged part 117 of the eave part 116 of the display panel 11 and the abutting part 134 abuts on the abutted part 118, thus the sliding of the back cover 13 stops. At this time, the engaged part 117 provided adjacent to the abutted part 118 on the eave part 116 of the display panel 11 is a pouch-shaped portion provided with an engaging recess 117a. A width dimension W11 of the engaging claw as the engaging part 133 when viewed from the plan-view direction D14 with respect to the back cover 13 is a dimension that the engaging claw press-fits into the engaging recess. This press-fitting uniquely determines the position of the back cover 13 in the right-left direction D11 with respect to the slide receiving part which is the combination of the display panel 11 and the device housing 12. Consequently, the fixing parts 131 of the back cover 13 are positioned in the right-left direction D11 with respect to the fixed parts 123 of the device housing 12. This positioning by the press-fitting of the engaging parts 133 is also performed similarly for the engagement portions 133 at two locations, among the engaging parts 133 at four locations, that are nearer the center and not adjacent to the abutting parts 134.

Figure 24:
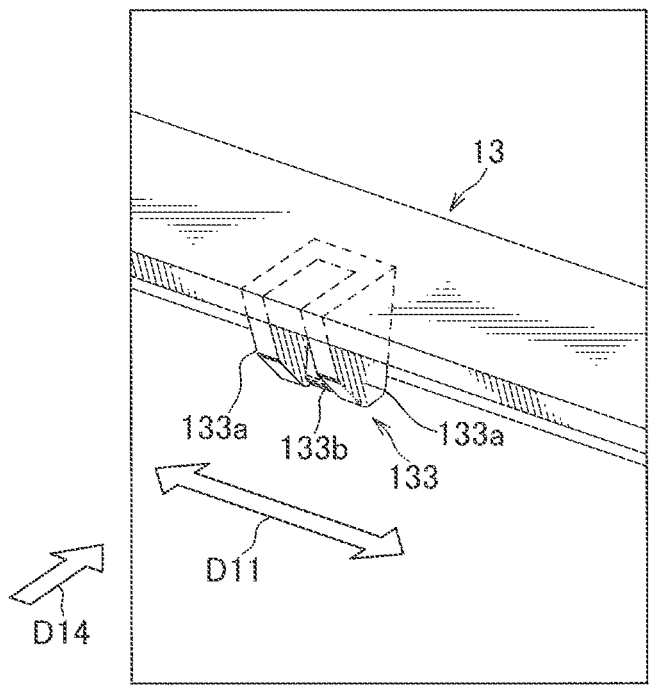
FIG. 24 is an enlarged perspective view of the engaging part provided on the inner face of the back cover and not adjacent to the abutting part.
Figure 25:
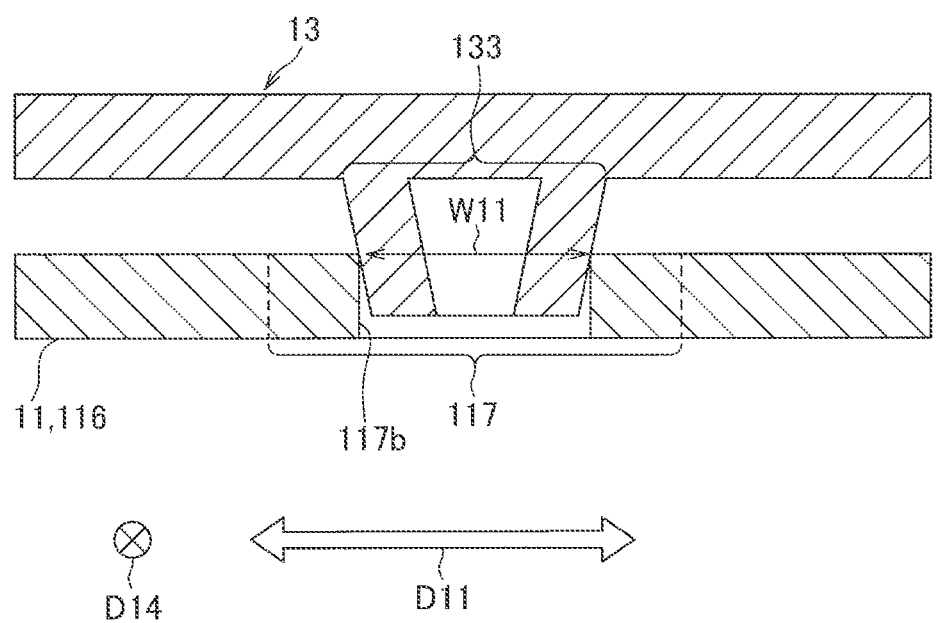
FIG. 25 is an enlarged transverse section along the right-left direction showing the engaging part and the engaged part, illustrating a state in which the engaging part of the back cover shown in FIG. 24 is engaged with the engaged part of the display panel.

FIG. 24 is an enlarged perspective view of the engaging part provided on the inner face of the back cover and not adjacent to the abutting part. Further, FIG. 25 is an enlarged transverse section along the right-left direction showing the engaging part and the engaged part, illustrating a state in which the engaging part of the back cover shown in FIG. 24 is engaged with the engaged part of the display panel.

The engaging part 133 provided on the inner face of the back cover 13 nearer the center in the right-left direction D11 and not adjacent to the abutting part 134 has a shape similar to the engaging part 133 on the both ends and adjacent to the abutting part 134. That is, the engaging part 133 has a shape including the pair of claw ribs 133a and the connecting rib 133b. In contrast, the engaged part 117 provided on the eave part 116 of the display panel 11 nearer the center in the right-left direction D11 and not adjacent to the abutted part 118 is provided with an engaging hole 117b penetrating the eave part 116, unlike the engaged part 117 on the both ends. The engaging claw as the engaging part 133 nearer the center has a width dimension W11 when viewed from the plan-view direction D14 that is a dimension that the engaging claw press-fits to the engaging hole 117b of the engaged part 117. This press-fitting performed nearer the center also contributes to the positioning of the fixing parts 131 of the back cover 13 with respect to the fixed parts 123 of the device housing 12 during the attachment of the back cover 13.

The above-described attachment structure of the back cover 13 of the display device 1 of this embodiment can provide advantageous effects as described below.

That is, according to the display device 1 described above, the back cover 13 as the slide attaching part is attached with respect to the slide receiving part including the device housing 12 by sliding it in the sliding direction D12 from the non-occulted portion 12b toward the occulted portion 12a of the device housing 12. In addition, the fixing of the back cover 13 is performed by the engagement at the non-occulted portion 12b and the fixation at the occulted portion 12a. In the non-occulted portion 12b of the device housing 12, the engaging parts 133 of the back cover 13 are simply engaged with the engaged parts 117 of the display panel 11 that constitutes the slide receiving part together with the device housing 12, thus no fixing component such as a screw is exposed on its outer periphery. On the other hand, the fixing of the fixing parts 131 of the back cover 13 with respect to the fixed parts 123 of the device housing 12 is performed in the occulted portion 12a of the device housing 12, thus even when the screws 132 are used to perform this fixing, these screws 132 will be hidden from an observer of the liquid crystal screen 111 when installed. Thus, according to the display device 1 described above, by adopting the sliding, the engagement, and the fixation at the occulted portion 12a, it is possible to improve the appearance without requiring installation of a hood for hiding the fixing components exposed on the outer periphery described above. Further, since the hood is not required in the installation, it is possible to improve the degree of freedom of the attachment position and it is also possible to improve the design when installed.

In this embodiment, the screw hole 123a is provided in the fixed part 123 of the device housing 12. On the other hand, the fixing part 131 of the back cover 13 is a portion which protrudes so as to overlap the fixed parts 123 and on which the through hole 131a for screw fixation is provided at a position communicating with the screw hole 123a. According to this configuration, the fixation in the occulted portion 12a is performed by screwing the screw 132 into the screw hole 123a of the fixed part 123 of the device housing 12 via the through hole 131a of the fixing part 131 of the back cover 13. Thus, according to the above-described configuration, the screw 132 which is a common fixing component and which is easy to use is adopted expecting that the occulted portion 12a is hidden when installed, thus the fixing strength can be improved and the workability can be improved.

In this embodiment, the fixed part 123 is a boss protruding in a cylindrical shape and including the screw hole 123a therein. Further, the device housing 12 is provided with the guide slope 125 disposed adjacent to the boss and configured to guide the fixing part 131 to the distal end face of the boss during the attachment of the back cover 13. The guide slope 125 is a slope which extends in the sliding direction D12 toward the distal end face of the boss where the screw hole 123a opens, and which has a height that gradually increases with respect to the sliding direction D12. According to this configuration, the fixing part 131 is smoothly guided to the distal end face of the boss as the fixed part 123 by the guide slope 125 of the device housing 12 when attaching the back cover 13. This guiding by the guide slope 125 can further improve the workability regarding the attachment of the back cover 13.

Further, in this embodiment, the engaging recess 117a or the engaging hole 117b is provided in the engaged part 117 of the display panel 11 that constitutes the slide receiving part. The engaging part 133 on the back cover 13 is engaging claws configured to be fitted into and engaged with the engaging recess 117a or the engaging hole 117b. According to this configuration, by fitting the engaging claws as the engaging part 133 into the engaging recess 117a or the engaging hole 117b in the engaged part 117, it is possible to effectively prevent the situation such as, for the non-occulted portion 12b, the back cover 13 is accidentally detached from the device housing 12.

Further, in this embodiment, the engaging claw as the engaging part 133 is formed such that the cross-sectional shape thereof along the sliding direction D12 and intersecting the back cover 13 is a tapered shape tapered toward the distal end. According to this configuration, with the sliding of the back cover 13, the engaging claw having the tapered shape is smoothly fitted into the engaging recess 117a or the engaging hole 117b of the display panel 11, thus it is possible to further improve the workability regarding the attachment of the back cover 13.

Further, in this embodiment, the width dimension W11 of the engaging claw as the engaging part 133 when viewed from the plan-view direction D14 with respect to the back cover 13 is a dimension that the engaging claw press-fits to the engaging recess 117a or the engaging hole 117b. By this press-fitting, the fixing parts 131 of the back cover 13 are positioned with respect to the fixed parts 123 of the device housing 12. According to this configuration, the press-fitting of the engaging claws can suppress the backlash of the engagement and can suppress abnormal noise caused for example by component impingement repeated in the engaging part due to running vibrations in the use state where the display device is installed on the vehicle C11.

Further, in this embodiment, the display panel 11 forming the slide receiving part is provided with the abutted parts 118 on which the back cover 13 abuts during the attachment of the back cover 13 when the back cover 13 is moved to the attachment position where the fixing parts 131 overlap with the fixed parts 123. In addition, the back cover 13 is provided with the abutting parts 134 which abut on the abutted parts 118 when the back cover 13 reaches the above-described attachment position. The abutting of the abutting parts 134 with respect to the abutted parts 118 restricts the movement of the back cover 13 exceeding the above-described attachment position. According to this configuration, the movement of the back cover 13 is restricted by the abutting parts 134 of the back cover 13 abutting on the abutted parts 118 of the display panel 11, thereby positioning the fixing parts 131 in the sliding direction D12 with respect to the fixed parts 123. This positioning can further improve the workability regarding the attachment of the back cover 13.

Further, in this embodiment, the abutted parts 118 are provided adjacent to the engaged parts 117 in the display panel 11, and the abutting parts 134 are provided adjacent to the engaging parts 133 in the back cover 13. According to this configuration, by engaging the engaging parts 133 with the engaged parts 117, the abutting parts 134 disposed adjacent to the engaging parts 133 can be successfully abutted on the abutted parts 118 disposed adjacent to the engaged parts 117 without positional displacement and such.

Further, in this embodiment, the back cover 13 is provided with the ribs 135 formed so as to extend in the sliding direction D12. In addition, the device housing 12 is provided with the positioning rails 126 extending in the sliding direction D12 and configured to receive the ribs 135 during the attachment of the back cover 13 to position the fixing parts 131 with respect to the fixed parts 123. According to this configuration, by sliding the back cover 13 so that the ribs 135 of the back cover 13 are received in the positioning rails 126 of the device housing 12, the fixing parts 131 can be successfully positioned with respect to the fixed parts 123.

Further, in this embodiment, the positioning rail 126 of the device housing 12 is a groove portion that opens so that the side thereof that receives the rib 135 during the attachment of the back cover 13 opens more widely than the rest of the portion. According to this configuration, the ribs 135 can be smoothly entered into the positioning rails 126 during the attachment of the back cover 13.

Further, in this embodiment, the slide attaching part is the back cover 13 which is configured to be attached to cover the back side of the device housing 12. According to this configuration, the back cover 13 as the slide attaching part can be attached such that the fixation screws 132 are not visible by an observer of the liquid crystal screen 111, thereby improving the appearance of the display device 1 including the back cover 13.

We pause the explanation of the display device 1 of the embodiment shown in FIG. 1 to FIG. 9 and FIG. 13 to FIG. 25, and will describe a third modified example which is also different from the first and second modified examples shown in FIG. 10 to FIG. 12.

Figure 26:
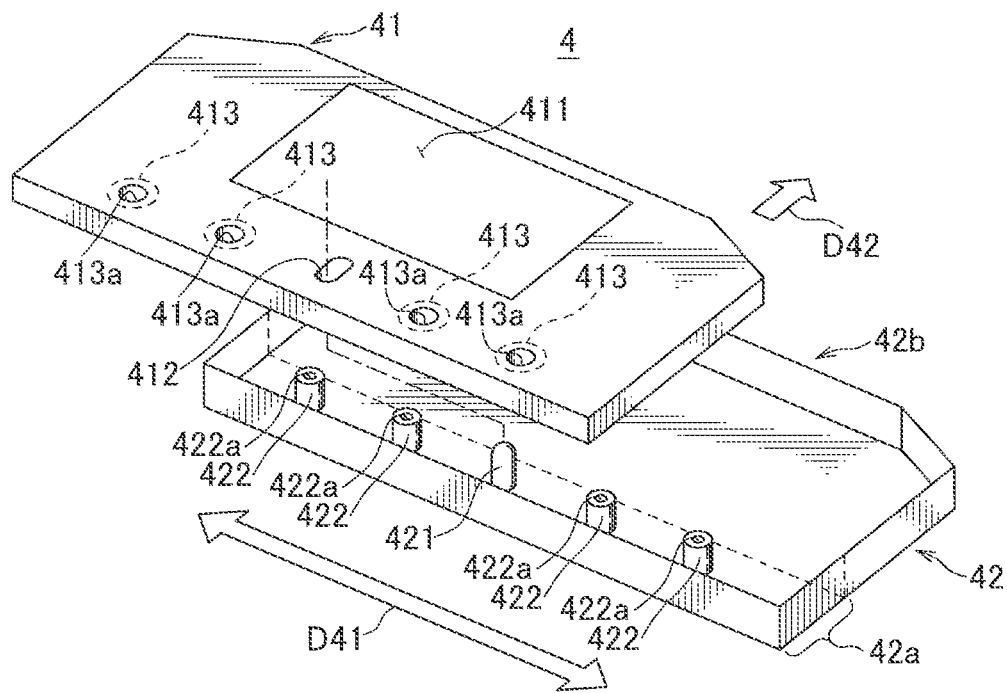
FIG. 26 is an exploded perspective view of a display device of a third modified example.

FIG. 26 is an exploded perspective view of a display device of a third modified example.

In a display device 4 of the third modified example, a display panel 41 including a liquid crystal screen 411 as the slide attaching part is attached to a device housing 42 so as to cover the side of the device housing 42 on which the liquid crystal screen 411 is arranged. In this third modified example, the back cover is not provided, and the device housing 42 corresponds to the slide receiving part.

In this modified example, the display panel 41 is attached to the device housing 42 by sliding it in a sliding direction D42 from an occulted portion 42a located on the lower end side of the device housing 42 in the upright position toward a non-occulted portion 42b located on the upper end side of the device housing 42. In this modified example, the following configuration for guiding this sliding is provided. First, the device housing 42 is provided with a pin 421 protruding toward the display panel 41. Further, the display panel 41 is provided with a guide hole 412 which is formed in an elongated hole-shape extending in the sliding direction D42 and which is configured to receive the pin 421 during the attachment of the display panel 41 to guide the sliding movement of the display panel 41.

The pin 421 is provided in the occulted portion 42a on the lower end side of the device housing 42. Further, the occulted portion 42a is provided with bosses as the fixed parts 422 of the device housing 42 which are configured to fix the display panel 41 with screws and which are disposed at four locations aligned in a row in the right-left direction D41 together with the pin 421, the boss protruding in a cylindrical shape and including a screw hole 422a therein.

The guide hole 412 is formed in a region on the lower end side of the display panel 41 which overlaps the occulted portion 42a of the device housing 42 and which is hidden together with the occulted portion 42a of the device housing 42 when the device housing 42 is installed in an upright position to the instrument panel C112 as shown in FIG. 1. Further, this region on the lower end side is provided with fixing parts 413 at four locations configured to be fixed to the fixed parts 422 of the device housing 42 and aligned in a row in the right-left direction D41 together with the guide hole 412. Each fixing part 413 is a small region in the region on the lower end side of the display panel 41 where through holes 413a for screw fixation are formed.

The display panel 41 is attached to the device housing 42 via stages as described below.

Figure 27:
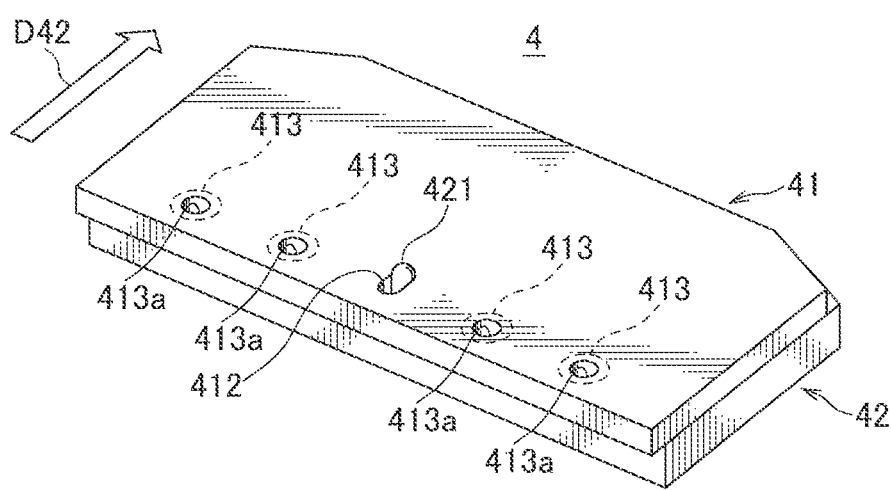
FIG. 27 is a schematic diagram showing a first stage in attachment of the display panel.
Figure 28:
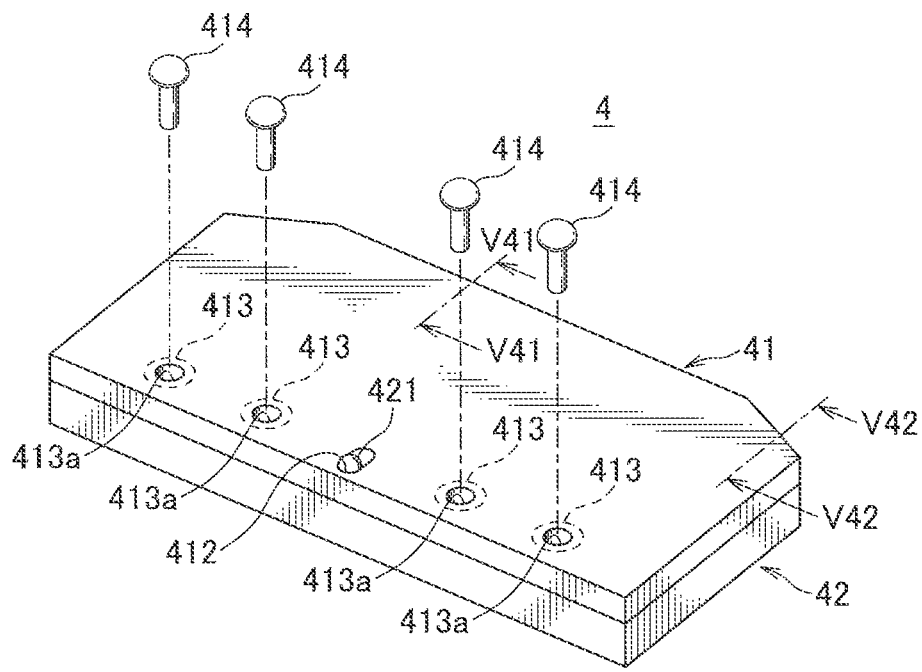
FIG. 28 is a schematic diagram showing a second stage in the attachment of the display panel.

FIG. 27 is a schematic diagram showing the first stage in the attachment of the display panel, and FIG. 28 is a schematic diagram showing the second stage in the attachment of the display panel.

In the display device 4 of this modified example, in the first stage shown in FIG. 27, the display panel 41 is placed onto the device housing 42 so that the pin 421 penetrates the guide hole 412 at a position displaced to a corner on an upper end side of the guide hole 412. In this stage, the display panel 41 is displaced downward relative to the device housing 42. Thereafter, the display panel 41 is moved to slide in the sliding direction D42, and the positional displacement of the display panel 41 with respect to the device housing 42 is eliminated as in shown in FIG. 28 as the second stage. The sliding movement of the display panel 41 at this time is guided by the guide hole 412 receiving the pin 421.

Figure 29:
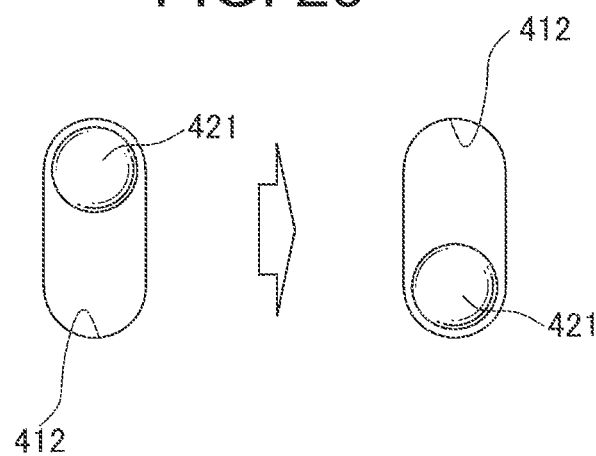
FIG. 29 is a schematic diagram illustrating how sliding movement of the display panel shown in FIG. 27

FIG. 29 is a schematic diagram illustrating how the sliding movement of the display panel shown in FIG. 27 and FIG. 28 is guided by the guide hole receiving the pin.

As shown in FIG. 29, in the first stage prior to the sliding, the pin 421 penetrates the guide hole 412 at the position displaced to the corner on the upper end side of the guide hole 412 as described above. The display panel 41 is then moved to slide, and this movement of the display panel 41 causes the pin 421 to move within the guide hole 412 along the extending direction of the guide hole 412 so that the pin 421 is guided in the sliding direction D42. The sliding movement as described above eliminates the positional displacement of the display panel 41 with respect to the device housing 42, and at this stage, the through holes 413a of the fixing parts 413 of the display panel 41 communicate with the screw holes 422a of the fixed parts 422 of the device housing 42. Screws 414 are then screwed into the screw holes 422a through the through holes 413a to fasten and fix the fixing parts 413 to the fixed parts 422. On the upper end side opposite to the fixing parts 413 and the fixed parts 422 of the lower end side, the display panel 41 engages with the device housing 42 during the sliding as follows.

Figure 30:
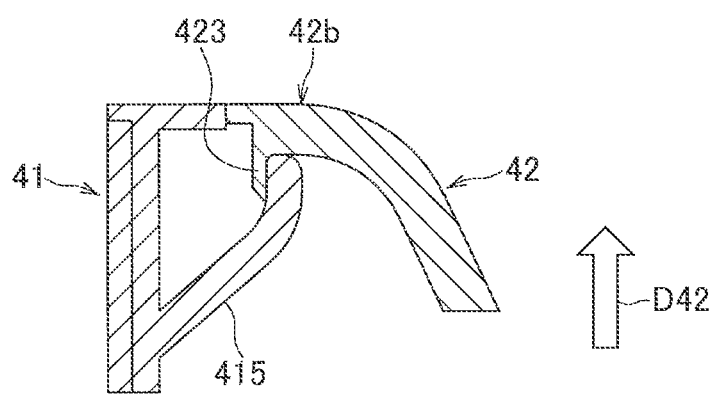
FIG. 30 shows an engagement structure for the display panel and the device housing in a schematic cross-section taken along a line V41-V41 in FIG. 28.
Figure 31:
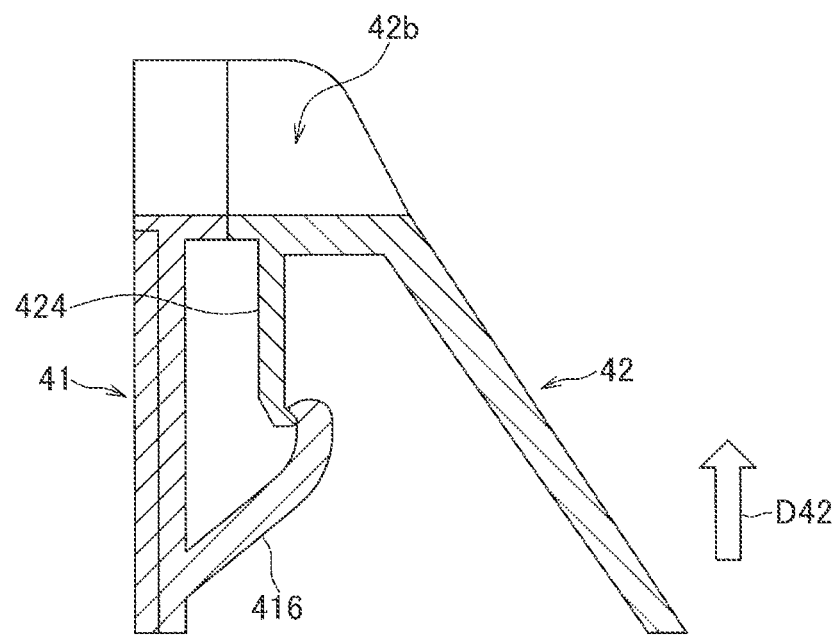
FIG. 31 shows the engagement structure for the display panel and the device housing in a schematic cross-section taken along a line V42-V42 in FIG. 28.

FIG. 30 shows an engagement structure for the display panel and the device housing in a schematic cross-section taken along a line V41-V41 in FIG. 28, and FIG. 31 shows an engagement structure for the display panel and the device housing in a schematic cross-section taken along a line V42-V42 in FIG. 28.

A first engagement structure shown in FIG. 30 is an engagement structure at a central part on the upper end side of the display panel 41. This first engagement structure is a fitting structure for a first engaging part 415 of the display panel 41 and a first engaged part 423 of the device housing 42. The first engaging part 415 is a portion disposed at the central part on the upper end side of the display panel 41, which has a branch-like cross-sectional shape and extends in the sliding direction D42 while extending obliquely to the inner side of the device housing 42. The first engaged part 423 on the other side is a rib disposed at the central part of the non-occulted portion 42b on the upper end side of the device housing 42, which extends in a direction opposite to the sliding direction D42.

The second engagement structure shown in FIG. 31 is an engagement structure on the lateral face side on the upper end side of the display panel 41, and, similarly to the first engagement structure described above, it is a fitting structure for a second engaging part 416 of the display panel 41 and a second engaged part 424 of the device housing 42. The second engaging part 416 is a portion on the lateral face side on the upper end side of the display panel 41, which is one step lower than the first engaging part 415 and which has a branch-like cross-sectional shape and extends in the sliding direction D42. The second engaged part 424 on the other side is a rib disposed on the lateral face side of the non-occulted portion 42b on the upper end side of the device housing 42, which is one step lower than the first engaged part 423 and which extends in a direction opposite to the sliding direction D42.

When the display panel 41 is moved to slide in the sliding direction D42, the following engagement is performed on the upper end side of each of the display panel 41 and the device housing 42. First, at the central part, a distal end part of the first engaging part 415 of the display panel 41 is fitted to and engaged with the first engaged part 423 of the device housing 42 so as to overlap the first engaged part 423, as shown in FIG. 30. At the same time, on the lateral face side, respective distal end parts of the second engaging part 416 of the display panel 41 and the second engaged part 424 of the device housing 42 are fitted to and engaged with each other in a hooked manner, as shown in FIG. 31. In this modified example, the display panel 41 is fixed to the device housing 42 by the screw fixation at the occulted portion 42a shown in FIG. 28 and by the engagement at the non-occulted portion 42b shown in FIG. 30 and FIG. 31, providing the completed display device 4.

As with the case of the above-described embodiment, in the configuration of the above-described third modified example also, it is possible to improve the appearance of the display device 4 without requiring an installation of a hood.

Further, in the configuration of the third modified example, the device housing 42 as a slide receiving part is provided with the pin 421, and the display panel 41 as the slide attaching part is provided with the elongated hole-shaped guide hole 412 that receives the pin 421 to guide the sliding movement of the display panel 41. According to this configuration, with the guide hole 412 receiving the pin 421, the sliding of the display panel 41 can be successfully guided and thus the workability regarding the attachment work can be improved.

Further, in the configuration of the third modified example, unlike the above-described embodiment, the slide attaching part is the display panel 41. According to this configuration, the display panel 41 can be attached such that the fixation screws 414 are not visible by an observer of the liquid crystal screen 411, thereby improving the appearance of the display device 4.

The description of the third modified example ends here, and now we return to the description relating to the embodiment shown in FIG. 1 to FIG. 9 and FIG. 13 to FIG. 25.

In this embodiment, unlike the third modified example illustrated in FIG. 26 to FIG. 31, the display panel 11 overlaps the opening of the device housing 12 and is fixed with screws as shown in FIG. 5 without sliding the display panel 11. Here, the display device 1 of this embodiment is provided with the following positioning structure for positioning the display panel 11 with respect to the device housing 12 such that the plurality of through holes 115 communicates with the plurality of screw holes 122.

Figure 32:
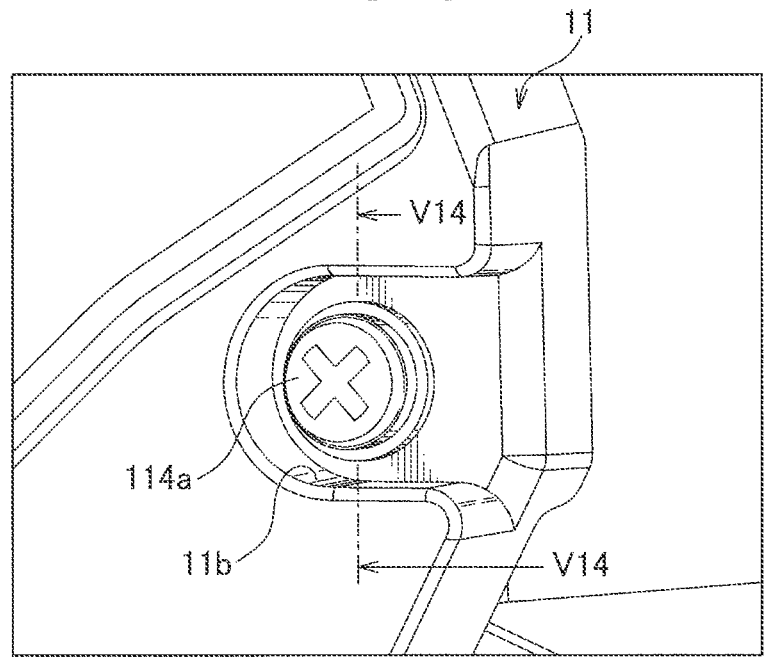
FIG. 32 shows a positioning structure for positioning the display panel with respect to the device housing, viewed from the display panel side.
Figure 33:
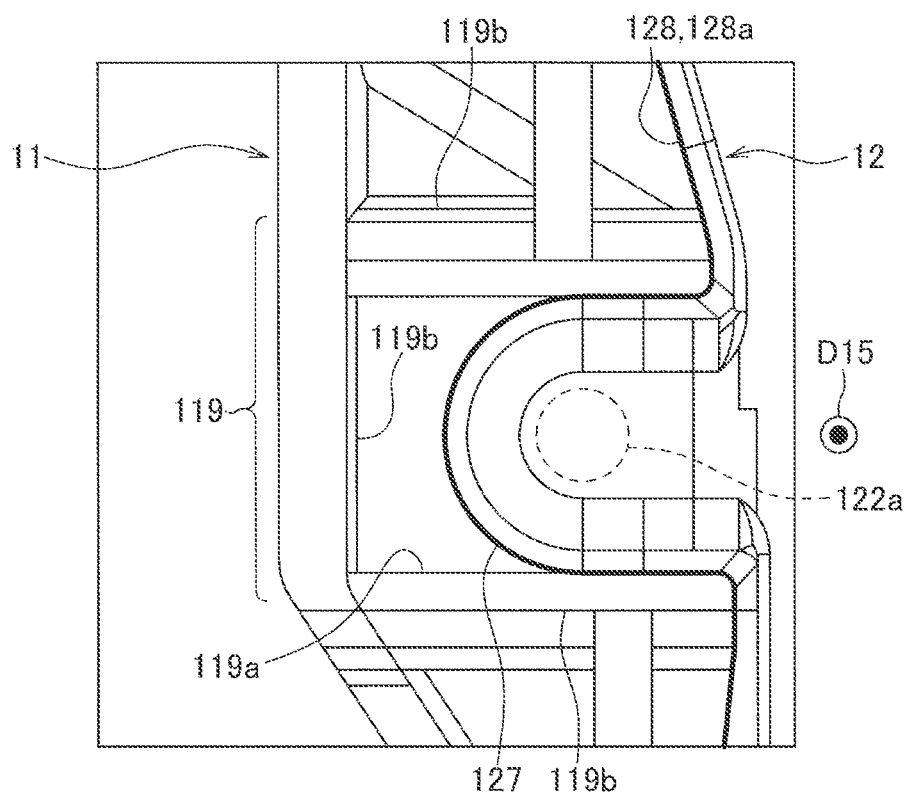
FIG. 33 shows the positioning structure of FIG. 32 viewed from the device housing side.
Figure 34:
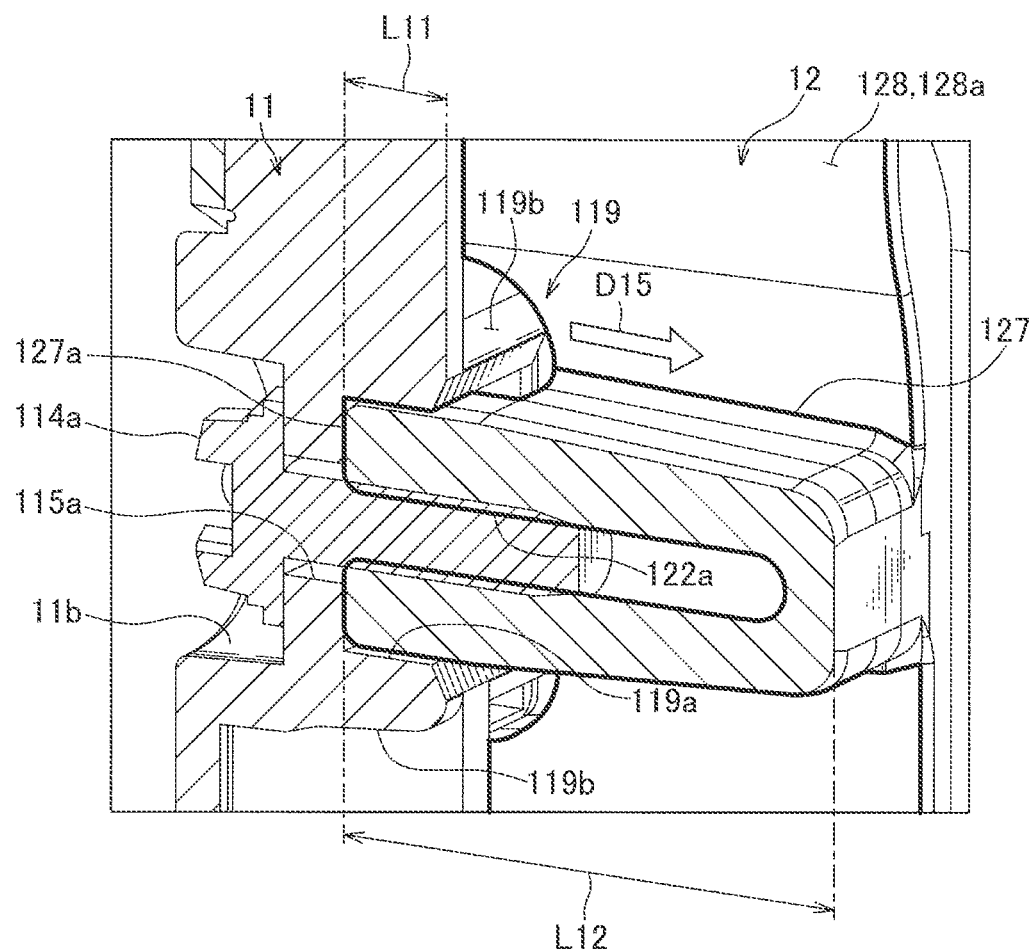
FIG. 34 shows the positioning structure of FIG. 32 in a cross-section taken along a line V14-V14 in FIG. 32.

FIG. 32 shows a positioning structure for positioning the display panel with respect to the device housing, viewed from the display panel side, and FIG. 33 shows the positioning structure of FIG. 32 viewed from the device housing side. FIG. 34 shows the positioning structure of FIG. 32 in a cross-section taken along a line V14-V14 in FIG. 32.

The positioning structure shown in FIG. 32 to FIG. 34 is provided for each of the screws 114a at two locations on the both ends in the right-left direction D11 among the plurality of fixation screws 114 of the display panel 11 shown in FIG. 3 and FIG. 5. These positioning structures at the two locations are the same structure with each other, and FIG. 32 to FIG. 34 show, as a representative example, the structure provided for the right screw 114a of FIG. 3 and FIG. 5.

In this positioning structure, among the through hole 115a and the screw hole 122a for the screw fixation by the screw 114a, the through hole 115a is formed on the display panel 11 as a first hole, and the screw hole 122a is formed on the device housing 12 as a second hole. Further, a display-side positioning part 119 is provided on the display panel 11, and a housing-side positioning part 127 is provided on the device housing 12. The display-side positioning part 119 is a portion provided with the through hole 115a and configured to fit to the housing-side positioning part 127 that is a portion of the device housing 12 to position the display panel 11 with respect to the device housing 12. The housing-side positioning part 127 is a portion which is configured to fit to the display-side positioning part 119 to perform the positioning and on which the screw hole 122a is formed to communicate with the through hole 115a when fitted.

Further, the display-side positioning part 119 is a portion which is provided with a recessed part 119a opening toward the device housing 12 and on which the through hole 115a is formed to penetrate through the bottom of the recessed part 119a. On the other hand, the housing-side positioning part 127 is a protruded part configured to fit to the recessed part 119a of the display-side positioning part 119 and is a portion on which the screw hole 122a is formed so as to open on an abutting face 127a that abuts on the bottom of the recessed part 119a when the protruded part is fitted to the recessed part 119a. Further, the protruded part as the housing-side positioning part 127 is formed thick in an insertion direction D15 of the screw 114a, and the screw hole 122a is bored in the insertion direction D15 from the abutting face 127a.

Further, the protruded part as the housing-side positioning part 127 is formed so as to protrude from the outer face of the peripheral wall 128 of the device housing 12. On the other hand, the display panel 11 is a member which extends wider than the opening of the device housing 12 that is covered by the display panel 11, and the display-side positioning part 119 is formed on an extending portion extending beyond the opening of the device housing 12 toward the outer periphery side so as to face the protruded part described above. Specifically, the display-side positioning part 119 includes ribs 119b provided on the back face of the display panel 11 facing the device housing 12, the ribs 119b defining the recessed part 119a in which the housing-side positioning part 127 is accommodated when the opening is covered by the display panel 11. This ribs 119b are formed on the above-described extending portion extending beyond the opening and are formed in a U-shape so as to surround, when the opening is covered by the display panel 11, the housing-side positioning part 127 on three sides excluding the peripheral wall 128 of the device housing 12. A space surrounded by the U-shaped ribs 119b corresponds to the recessed part that accommodates the protruded part as the housing-side positioning part 127. Further, as shown in FIG. 34, in the display-side positioning part 119, a depth L11 of the recessed part 119a is less than a length L12, from the abutting face 127a, of the housing-side positioning part 127 that is formed thick in the insertion direction D15 of the screw 114a.

Further, in this embodiment, a pair of the protruded parts as the housing-side positioning parts 127 are formed to protrude from the respective outer face of a pair of wall portions 128a facing each other of the peripheral wall 128 of the device housing 12. Further, a pair of the recessed parts 119a in the display-side positioning part 119 is formed on the back face of the display panel 11 so the pair of the protruded parts fit thereto, respectively. By forming each positioning part on the positions described above, the positioning structure is provided to each of the screws 114a at two locations on the both ends in the right-left direction D11 among the plurality of screws 114 for the screw fixation of the display panel 11. Further, a portion of the display panel 11 on its outer face that is opposite to the device housing 12 and that corresponds to the display-side positioning part 119 is provided with an outer face recess 11b recessed to accommodate a screw head of the screw 114a passed through the through hole 115a.

The above-described positioning structures of the display device 1 of this embodiment can provide advantageous effects as described below.

That is, according to the display device 1 described above, the through hole 115a is formed as a first hole for the screw fixation on the display-side positioning part 119 of the display panel 11. Further, the screw hole 122a as a second hole for the screw fixation is formed on the housing-side positioning part 127 of the device housing 12 that fits to the display-side positioning part 119 to perform the positioning. By thus forming the respective screw-fixation holes on the respective positioning parts of the display panel 11 and the device housing 12, the positioning of the display panel 11 and the device housing 12 can be performed while suppressing an increase in size of the device, and then the fastening by the screws 114a can be performed.

In this embodiment, the display-side positioning part 119 is a portion where the through hole 115a is formed on the bottom of the recessed part 119a, and the housing-side positioning part 127 is the protruded part where the screw hole 122a is formed so as to open on the abutting face 127a that abuts on the bottom of the recessed part 119a. According to this configuration, the recessed part 119a is provided to the display-side positioning part 119 of the display panel 11 that is put onto the device housing 12 to cover the opening of the device housing 12 during the assembly, and the housing-side positioning part 127 of the device housing 12 is the protruded part that fits to the recessed part 119a. With such recessed-and-protruded structure, the recessed part 119a of the display-side positioning part 119 can be put onto the housing-side positioning part 127 to perform the positioning of the both in a manner adapting to the work of putting the display panel 11 onto the device housing 12, thereby improving the workability regarding the positioning.

Further, in this embodiment, the through hole 115a is formed so as to penetrate the bottom of the recessed part 119a of the display-side positioning part 119. Moreover, the protruded part as the device-side positioning part 127 is formed thick in the insertion direction D15 of the screw 114a, and the screw hole 122a is bored in the insertion direction D15 from the abutting face 127a that abuts on the bottom of the recessed part 119a. According to this configuration, the screw 114a is screwed into the screw hole 122a of the device housing 12 from the display panel 11 side through the through hole 115a after the positioning, thus the display panel 11 can be fixed using the screw to the device housing 12 under good workability.

Further, in this embodiment, the display panel 11 includes, on the outer face thereof, the outer face recess 11b recessed so as to accommodate the screw head of the screw 114a penetrating through the through hole 115a. According to this configuration, the screw head is accommodated in the outer face recess 11b on the display panel 11 side, thus the appearance regarding the screw fixation portion can be improved.

Further, in this embodiment, the display-side positioning part 119 is provided with the ribs 119b formed so as to surround the housing-side positioning part 127 and is configured accommodate the housing-side positioning part 127 in the space inside the ribs 119b. According to this configuration, the positioning can be performed effectively by providing the housing-side positioning part 127 on the outer face of the peripheral wall 128 without diminishing the component accommodating space inside the device housing 12, and placing the housing-side positioning part 127 in the recessed part 119a inside the ribs 119b of the display-side positioning part 119.

Further, in this embodiment, the protruded parts as the housing-side positioning parts 127 and the recessed parts 119a of the display-side positioning part 119 are respectively formed in a pair. According to this configuration, by fitting the pair of protruded parts to the pair of recessed parts 119a, the display panel 11 can be securely positioned with respect to the device housing 12.

Further, in this embodiment, the depth L11 of the recessed part 119a of the display-side positioning part 119 is less than the length L12 of the housing-side positioning part 127. According to this configuration, the long, protruded part of the housing-side positioning part 127 protrudes from the shallow recessed part 119a of the display-side positioning part 119 when fitted, thus it is possible to visually confirm the fitting state of both positioning parts from the side of the device housing 12, and this is preferable.

The embodiments described above as well as the first to third modified examples are only representative forms of the display device, and the display device is not limited to these embodiments or modified examples. That is, the display device can be variously modified without departing from its gist.

For example, the above-described embodiment and the first to third modified examples show, as examples of the display device, the display devices 1, 2 and 3 that are configured to be installed in the upright position on the instrument panel C112 of the vehicle C11. However, the display device is not limited thereto, and specific installation place and installation position can be set arbitrarily.

Further, in the above-described embodiment and the first to third modified examples, the display panels 11, 21, 31 and 41 including the liquid crystal screens 111, 211, 311 and 411 are shown as examples of the display panel. However, the display panel is not limited thereto, it may include a display screen of a type other than the liquid crystal screen as long as it includes a display screen.

Further, the above-described embodiment and the first to third modified examples show, as examples of the display panel, the display panels 11, 21, 31 and 41 having the substantially rectangular shape in a front view as shown in various drawings. However, the display panel is not limited thereto and specific shape thereof can be set arbitrarily.

Further, the above-described embodiment and the first to third modified examples show, as examples of the display device, the display devices 1, 2, 3 and 4 in which the pair of indicator regions 112 is disposed at positions shifted to the right and the left with respect to the liquid crystal screens 111, 211, 311 and 411. However, the display device is not limited thereto, and arrangement and number of the display screen and/or the indicator region in the display panel can be set appropriately depending on the application and such.

Further, the above-described embodiment shows, as one example of the display device, the display device 1 in which the control substrate 15 is arranged so as not to face a portion on the upper end side in the upright position of each of the liquid crystal screen 111 and the indicator substrate 14. However, other arrangements are also possible as long as the control substrate is distant from the display panel than the indicator substrate and arranged so as not to face at least a portion of each of the display screen and the indicator substrate. However, by arranging the control substrate 15 so as not to face a portion of the upper end side of each of the liquid crystal screen 111 and the indicator substrate 14, it is possible to improve the appearance of the display device 1 in the case where the display device 1 is arranged to protrude from the instrument panel C112, as described above.

Further, the above-described embodiment shows, as one example of the display device, the display device 1 in which the indicator substrate 14 and the control substrate 15 are connector connected to each other. However, other forms of connection of internal substrates are also possible. However, by using the connector connection it is possible to reduce the space required for the substrate connection as described above.

Further, the above-described embodiment shows, as one example of the display device, the display device 1 in which the indicator substrate 14 and the control substrate 15 are together accommodated in one device housing 12. However, the display device is not limited thereto, and it may be divided into a plurality of housings to accommodate the substrates. However, by accommodating in one housing, it is possible to reduce the number of components relating to the housing which is preferable, as described above.

Further, the above-described embodiment shows, as one example of the indicator region of the display panel, the indicator region 112 in which the diffusing portion 112b and the blocking portion 112c are integrally formed by two-color molding is shown. However, the indicator region is not limited thereto, the diffusing portion and the blocking portion can be formed as separate parts and combined by bonding or screw fixation or the like. However, by integrally forming using two-color molding, it is possible to further reduce the thickness of the display device 1 while suppressing light leakage and luminance unevenness, as described above.

Further, the first modified example described above shows, as another example of the substrate arrangement, the control substrate 25 disposed below the indicator substrate 24 and arranged along the intersecting direction D24. However, other arrangements are also possible as long as the control substrate is distant from the display panel than the indicator substrate and disposed so as not to face at least a portion of each of the display screen and the indicator substrate. However, according to the above-described intersecting arrangement, it is possible to reduce the overall thickness of the portion corresponding to the display panel 21, as described above.

Further, the second modified example described above shows, as one example of the display device, the display device 3 in which the indicator substrate 34 and the control substrate 35 are separately accommodated in two housings. However, the display device is not limited thereto, it may be configured to accommodate all substrates together in one housing. However, by accommodating the indicator substrate 34 and the control substrate 35 separately in two housings, it is possible to reduce the overall thickness of the housing that is viewed by an observer.

Further, the second modified example described above shows, as one example of the display device, the display device 3 in which the indicator substrate 34 and the control substrate 35 are connected via the cable connection. However, other forms of connection of internal substrates are also possible. However, by using the cable connection, it is possible to improve the degree of freedom of the design of installation onto the installation places as described above.

Further, the above-described embodiment shows, as one example of the display device, the display device 1 in which the fixing parts 131 of the back cover 13 as the slide attaching part and the fixed parts 123 of the device housing 12 constituting the slide receiving part are fixed using the screw fixation. However, the fixation of the slide attaching part and the slide receiving part is not limited to the screw fixation, and it is possible to adopt any fixing method. However, by adopting the screw fixation, it is possible to improve the fixing strength and improve the workability as described above.

Further, the above-described embodiment shows, as one example of the display device, the display device 1 in which the guide slope 125 is provided adjacent to the boss as the fixed part 123 in the device housing 12. However, the fixed part of the device housing may not be the boss, and the guide slope may not be provided. However, by providing the fixed part 123 as the boss and by providing the guide slope 125, it is possible to further improve the workability regarding the attachment of the back cover 13 as described above.

Further, the above-described embodiment shows the engaged part 117 including the engaging recess 117a or the engaging hole 117b as one example of the engaged part of the slide receiving part, and the engaging part 133 formed as the engaging claw as one example of the engaging part of the slide attaching part. However, the engaged part and the engaging part are not limited thereto, and other engagement structures are also possible. However, according to the engagement structure described above, it is possible to effectively prevent a situation such as the back cover 13 accidentally falling off from the device housing 12, as described above.

Further, in the above-described embodiment, the engaging claw a cross-sectional shape of which is a tapered shape is shown as one example of the engaging claw as the engaging part. However, the engaging claw as the engaging part is not limited thereto, and it may have a cross-sectional shape other than the tapered shape. However, according to the engaging claw having the tapered cross-sectional shape, it is possible to further improve the workability regarding the attachment of the back cover 13 as described above.

Further, in the above-described embodiment, the engaging claw configured to be press-fitted into the engaging recess 117a or the engaging hole 117b is shown as one example of the engaging claw as the engaging part. However, the engaging claw as the engaging part is not limited thereto and it may be inserted in a manner other than the press-fitting, e.g., it may be inserted into the engaging recess or the engaging hole with some backlash. However, the press-fitting of the engaging claw can suppress the abnormal noise in the use state where the display device is installed on the vehicle C11 as described above.

Further, the above-described embodiment shows, as one example of the display device, the display device 1 in which the display panel 11 constituting the slide receiving part is provided with the abutted parts 118, and the back cover 13 as the slide attaching part is provided with the abutting parts 134. However, the display device is not limited thereto, it may not be provided with the abutted parts or the abutting parts. However, by providing the abutted parts 118 and the abutting parts 134, it is possible to further improve the workability regarding the attachment of the back cover 13 as described above.

Further, in the above-described embodiment, the abutted part 118 provided adjacent to the engaged part 117 and the abutting part 134 provided adjacent to the engaging part 133 are shown as one example of the abutted part and the abutting part. However, the abutted part and the abutting part are not limited thereto, they may be provided distant from the engaged part and the engaging part, respectively. However, according to the above-described adjacent arrangement, the abutting part 134 can be abutted on the abutted part 118 in a successful manner with suppressed positional displacement, as described above.

Further, the above-described embodiment shows, as one example of the display device, the display device 1 in which the back cover 13 includes the ribs 135 and the display device housing 12 includes the positioning rails 126. However, the display device is not limited thereto, it may be not provided with the ribs and the positioning rails described above. However, by providing the ribs 135 and the positioning rails 126, the fixing parts 131 of the back cover 13 can be successfully positioned with respect to the fixed parts 123 of the device housing 12 as described above.

Further, the above-described embodiment shows, as one example of the positioning rail, the positioning rail 126 that is a groove portion including the wide opening on the side for receiving the rib 135. However, the positioning rail is not limited thereto, it may be a groove having a constant width or the like. However, according to the positioning rail 126 configured as the groove portion including the wide opening, the rib 135 can be smoothly entered during the attachment of the back cover 13 as described above.

Further, in the above-described embodiment, the back cover 13 is shown as one example of the slide attaching part. However, the slide attaching part is not limited thereto, it may be of other forms as long as it can be slidably attached to the slide receiving part. However, by using the back cover 13 as the slide attaching part, it is possible to improve the appearance of the display device 1 including the back cover 13 as described above.

Further, the third modified example described above shows, as one example of the display device, the display device 4 in which the device housing 42 as the slide receiving part is provided with the pin 421, and the display panel 41 as the slide attaching part is provided with the guide hole 412. However, the display device is not limited thereto, and the pin of the slide receiving part and the guide hole of the slide attaching part may not be provided. However, by providing the guide hole 412 and the pin 421, it is possible to improve the workability in attaching the display panel 41 as the slide attaching part as described above.

Further, in the configuration of the third modified example described above, the display panel 41 is shown as one example of the slide attaching part. However, the slide attaching part is not limited thereto, it may be of other forms as long as it can be moved to slide and attached to the slide receiving part. However, by using the display panel 41 as the slide attaching part, it is possible to improve the appearance of the display device 4 including the display panel 41 as described above.

Further, the above-described embodiment shows, as one example of the display device, the display device 1 in which the through hole 115*a* for screw fixation is formed as a first hole on the display-side positioning part 119 and the screw hole 122*a* is formed as a second hole on the housing-side positioning part 127. However, the display device is not limited thereto, and the screw hole may be formed as a first hole on the display-side positioning part and the through hole may be formed as a second hole on the housing-side positioning part in a manner opposite to the above-described embodiment.

Further, the above-described embodiment shows, as one example of the display device, the display device 1 including the display-side positioning part 119 that is a portion where the through hole 115*a* is formed on the bottom of the recessed part 119*a*. Further, in this embodiment, the housing-side positioning part 127 is the protruded part provided with the screw hole 122*a* opening on the abutting face 127*a* that abuts on the bottom of the recessed part 119*a*. However, the positioning structure for the display panel and the device housing in the display device is not limited to this recessed-and-protruded structure as described above, and it may adopt an arbitral structure. However, according to the recessed-and-protruded structure as described above, it is possible to improve the workability regarding the positioning of the display panel 11 with respect to the device housing 12 as described above. Also, according to this configuration, the screw 114*a* is screwed into the screw hole 122*a* of the device housing 12 from the display panel 11 side through the through hole 115*a* after the positioning, thus the screw fixation can be performed under good workability as described above.

Further, the above-described embodiment shows, as one example of the display device, the display device 1 in which the outer face of the display panel 11 includes the outer face recess 11*b* that accommodates the screw head. However, the display device is not limited thereto, and the outer face of the display panel may not include the outer face recess. However, by providing the outer face recess 11*b*, it is possible to improve the appearance regarding the screw fixation portion as described above.

Further, the above-described embodiment shows, as one example of the display device, the display device 1 in which the housing-side positioning part 127 is the protruded part protruding from the outer face of the peripheral wall 128 of the device housing 12, and the display-side positioning part 119 includes the ribs 119*b* surrounding that protruded part. However, the display device is not limited thereto, that is, the formation position and shape and such of the housing-side positioning part and the display-side positioning part can be set arbitrary. However, by forming the housing-side positioning part 127 as the protruded part protruding to the outside of the housing, and by providing the display-side positioning part 119 with the ribs 119*b* surrounding that protruded part, it is possible to effectively perform the positioning without diminishing the component accommodating space as described above.

Further, the above-described embodiment shows, as one example of the display device, the display device 1 in which the protruded parts as the housing-side positioning parts 127 and the recessed parts 119*a* of the display-side positioning parts 119 are respectively provided in a pair. However, the display device is not limited thereto, that is, the number and such of the protruded parts as the housing-side positioning parts and the recessed parts of the display-side positioning parts can be set arbitrarily. However, by providing the protruded parts and the recessed parts in a pair, respectively, the display panel 11 can be securely positioned with respect to the device housing 12 as described above.

Further, the above-described embodiment shows, as one example of the display device, the display device 1 in which the depth L11 of the recessed part 119*a* of the display-side positioning part 119 is less than the length L12 of the housing-side positioning part 127. However, the display device is not limited thereto, and the magnitude relationship between the depth of the recessed part of the display-side positioning part and the length of the housing-side positioning part can be set arbitrarily. However, by adopting the magnitude relationship as described above, it is possible to visually confirm the fitting state of both positioning parts from the side of the device housing 12 as described above.

LIST OF REFERENCE SIGNS

1, 2, 3, 4 display device
11, 21, 31, 41 display panel
11*a* display-side occulted portion
11*b* outer face recess
12, 22, 42 device housing
12*a*, 42*a* occulted portion
12*b*, 42*b* non-occulted portion
12*c* central axis
13 back cover
14, 24, 34 indicator substrate
15, 25, 35 control substrate
32-1 first device housing
32-2 second device housing
36 connecting cable
111, 211, 311, 411 liquid crystal screen (display screen)
112 indicator region
112*a* indicator
112*b* diffusing portion
112*c* blocking portion
112*d* fixing flange
112*e*, 115, 115*a*, 131*a*, 413*a* through hole
113 panel frame
114, 114*a*, 132, 414 screw
116 eave part
117 engaged part
117*a* engaging hole
117*b* engaging recess
118 abutted part
119 display-side positioning part
119*a* recessed part
119*b*, 135 rib
121 accommodating space
122, 123*a*, 422*a* screw hole
123, 422 fixed part
125 guide slope
126 positioning rail
126L left inner face
126R right inner face 127 housing-side positioning part
127a abutting face
128 peripheral wall
131, 413 fixing part
133 engaging part
133a claw rib
133b, 134b connecting rib
134 abutting part
134a abutting rib
135a eave-shaped rib
135b rib body
141 LED light source (light source component)
321 first accommodating space
324 second accommodating space
412 guide hole
421 pin
415 first engaging part
416 second engaging part
423 first engaged part
424 second engaged part
C11, C31 vehicle
C112, C312 instrument panel
D11, D41 right-left direction
D12, D42 sliding direction
D13, D23 up-down direction
D14 plan-view direction
D15 insertion direction
D24 intersecting direction
L11 depth
L12 length
W11 width dimension

What is claimed is:

1. A display device comprising:
a display panel including a display screen, the display panel being provided with a first hole for screw fixation, the first hole being formed on an outer periphery side of the display screen; and
a device housing having a bottomed tube-shape and including an opening configured to be covered with the display panel, the device housing including a second hole, the second hole being formed at a position that communicates with the first hole, the first hole being one of a through hole and a screw hole, the second hole being the other of the through hole and the screw hole, the device housing being configured such that the display panel is fastened and fixed to the device housing by a screw passed through the through hole and screwed into the screw hole,
wherein
the display panel includes a display-side positioning part which is configured to fit to a portion of the device housing to perform positioning of the display panel with respect to the device housing and on which the first hole is formed, and
the device housing includes a housing-side positioning part which is configured to fit to the display-side positioning part to perform the positioning and on which the second hole is formed so as to communicate with the first hole when the housing-side positioning part is fitted to the display-side positioning part
the display-side positioning part is a portion provided with a recessed part opening toward the device housing, the first hole being formed on a bottom of the recessed part, and
the housing-side positioning part is a protruded part configured to fit to the recessed part, the second hole being formed on the housing-side positioning part so as to open on an abutting face that abuts on the bottom of the recessed part when the protruded part is fitted to the recessed part,
the display-side positioning part includes ribs disposed on a back face of the display panel that faces the device housing, and
a space surrounded by the ribs is the recessed part.

2. The display device according to claim 1, wherein
the first hole is the through hole formed so as to penetrate through the bottom of the recessed part, and
the protruded part is formed thick in an insertion direction of the screw, the screw hole being bored, as the second hole, in the insertion direction from the abutting face.

3. The display device according to claim 2, wherein the display panel is provided with an outer face recess that is recessed to accommodate a screw head of the screw passed through the through hole, the outer face recess being formed on an outer face of the display panel on a side opposite to the device housing at a portion corresponding to the display-side positioning part.

4. The display device according to claim 1, wherein the protruded part as the housing-side positioning part is formed to protrude from an outer face of a peripheral wall of the device housing,
the display panel is a member extending wider than the opening of the device housing, the ribs are formed so as to surround the housing-side positioning part on three sides excluding the peripheral wall when the display panel covers the opening.

5. The display device according to claim 4, wherein
a pair of the protruded parts as the housing-side positioning parts protrude from respective outer faces of a pair of wall portions, that faces each other, of the peripheral wall of the device housing, and
a pair of the recessed parts of the display-side positioning parts are formed on the back face of the display panel such that the pair of the protruded parts fits to the pair of the recessed parts, respectively.

6. The display device according to claim 1, wherein
a depth of the recessed part of the display-side positioning part is less than a length of the housing-side positioning part from the abutting face.

7. The display device according to claim 1, wherein
the ribs surround the housing-side positioning part on three sides excluding the peripheral wall when the display panel covers the opening.

* * * * *